United States Patent [19]
Cook et al.

[11] Patent Number: 5,455,570
[45] Date of Patent: Oct. 3, 1995

[54] METHODS AND APPARATUS FOR COMMUNICATION PROGRAM DATA SIGNALS VIA A REMOTE CONTROL UNIT

[76] Inventors: Alex M. Cook, 2290 Soaring La., Lawrenceville, Ga. 30244; Luis A. Rovira, 2643 Whiteleigh Ct., Atlanta, Ga. 30345; Curt M. Kuban, 1774 Skyland Glen Dr., Snellville, Ga. 30278; Emory L. McGinty, 1362 Fireside Ct., Lilburn, Ga. 30247; Jeffrey C. Ting, 650 Congress Pkwy.; Rueenguang A. Shyu, 3475 Haverhill Rowe, both of Lawrenceville, all of Ga. 30244

[21] Appl. No.: 320,107

[22] Filed: Oct. 7, 1994

Related U.S. Application Data

[60] Division of Ser. No. 795,888, Nov. 19, 1991, abandoned, which is a continuation-in-part of Ser. No. 618,744, Nov. 27, 1990, Pat. No. 5,239,540.

[51] Int. Cl.⁶ .................................................. H04Q 1/00
[52] U.S. Cl. ................... 340/825.22; 340/825.72; 359/43; 455/4.2
[58] Field of Search ............... 340/825.22, 825.25, 340/825.69, 825.72, 825.37; 455/4.2, 6.2; 359/43; 348/734; 371/37.2

[56] References Cited

U.S. PATENT DOCUMENTS

| | | | |
|---|---|---|---|
| 3,685,014 | 8/1972 | Hsiao | 371/37.2 |
| 4,010,322 | 3/1977 | Nathanson . | |
| 4,213,119 | 7/1980 | Ward et al. . | |
| 4,484,218 | 11/1984 | Boland | 455/4.2 |
| 4,578,674 | 3/1986 | Baker et al. | 340/710 |
| 4,623,887 | 11/1986 | Welles, II . | |
| 4,626,848 | 12/1986 | Ehlers . | |
| 4,673,911 | 6/1987 | Yoshida | 187/100 |
| 4,703,359 | 10/1987 | Rumbolt et al. . | |
| 4,718,112 | 1/1988 | Shinoda . | |
| 4,728,949 | 3/1988 | Platte | 340/825.37 |
| 4,746,919 | 5/1988 | Reitmeier . | |
| 4,755,883 | 7/1988 | Uehira | 358/194.1 |
| 4,764,981 | 8/1988 | Miyahara et al. . | |
| 4,825,200 | 4/1989 | Evans et al. . | |
| 4,825,209 | 4/1989 | Sasaki et al. . | |
| 4,855,725 | 8/1989 | Fernandez | 358/194.1 |
| 4,856,081 | 8/1989 | Smith . | |

(List continued on next page.)

FOREIGN PATENT DOCUMENTS

| | | |
|---|---|---|
| 54-48428 | 4/1977 | Japan . |
| 63-227195 | 9/1988 | Japan . |
| 2166328 | 4/1986 | United Kingdom . |
| WO84/01873 | 5/1984 | WIPO . |

OTHER PUBLICATIONS

Instructions for the JVC HR-D970U hi-fi stereo video cassette recorder, 1990, title page, pp. 1, 14 and 45.
"Digital signal accompanies fm broadcast to give station information to the listener," Electronics, 68 and 70, vol. 51, No. 21, Oct. 12, 1978.

*Primary Examiner*—Donald J. Yusko
*Assistant Examiner*—Brian Zimmerman

[57] ABSTRACT

A remote control system including a hand held remote control unit with an alphanumeric information display, for controlling and communicating with a first controlled device, such as a digital music tuner connected to a community antenna television (CATV) cable, and for controlling a selected one of a plurality of second controlled devices, such as CATV set-top units, VCRs, or television sets. A first, high speed, error free display information communications protocol is utilized for transmitting program content or other information from a device, such as the CATV-connected music tuner, to the remote control unit for display. A second or control communications protocol is utilized by the remote control unit for controlling the first controlled device and a selected one of the second controlled devices. The CATV cable-connected music tuner utilizes the 44.1 kHz Compact Disk (CD) clock signal embedded in digital music signals provided via the cable to derive clocking signals for implementing the display information communications protocol, resulting in an efficient, low cost electronic design.

5 Claims, 15 Drawing Sheets

U.S. PATENT DOCUMENTS

| | | | |
|---|---|---|---|
| 4,857,898 | 8/1989 | Smith . | |
| 4,868,893 | 9/1989 | Hammond . | |
| 4,887,308 | 12/1989 | Dutton . | |
| 4,959,720 | 9/1990 | Duffield et al. . | |
| 4,959,810 | 9/1990 | Darbee et al. . | |
| 5,003,396 | 3/1991 | Kang | 358/194.1 |
| 5,005,084 | 4/1991 | Skinner . | |
| 5,046,093 | 9/1991 | Wachob . | |
| 5,054,071 | 10/1991 | Bacon | 358/194.1 |
| 5,063,610 | 11/1991 | Alwadish . | |
| 5,099,507 | 3/1992 | Mukai | 340/825.44 |
| 5,109,222 | 4/1992 | Welty | 340/825 |
| 5,155,614 | 10/1992 | Carmen et al. | 359/189 |
| 5,204,768 | 4/1993 | Tsakiris et al. | 359/148 |
| 5,214,792 | 5/1993 | Alwadish . | |
| 5,237,327 | 8/1993 | Saitoh et al. | 341/176 |
| 5,276,692 | 1/1994 | Kwon | 371/5.1 |
| 5,307,055 | 4/1994 | Baskin et al. | 345/1 |

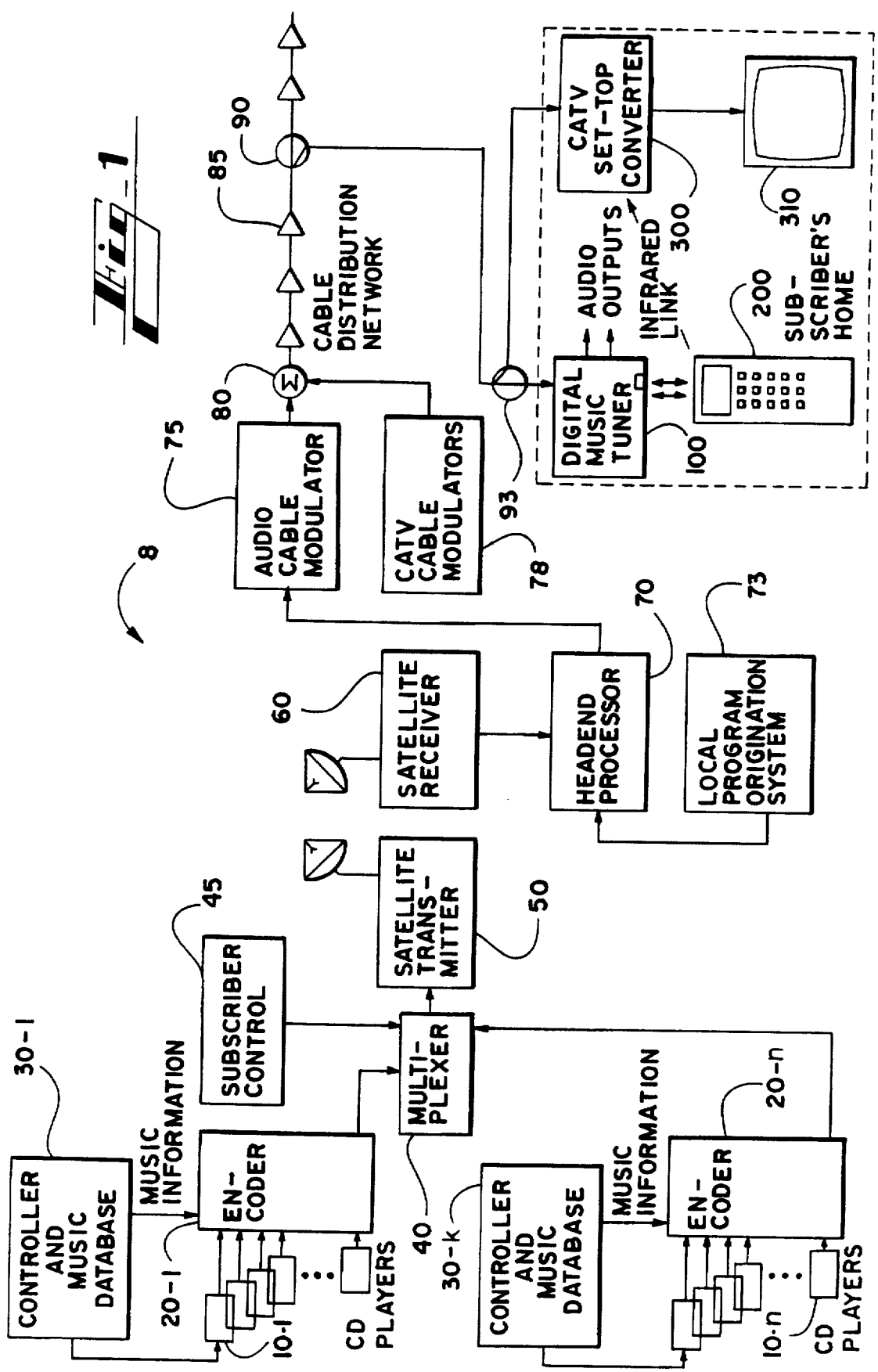

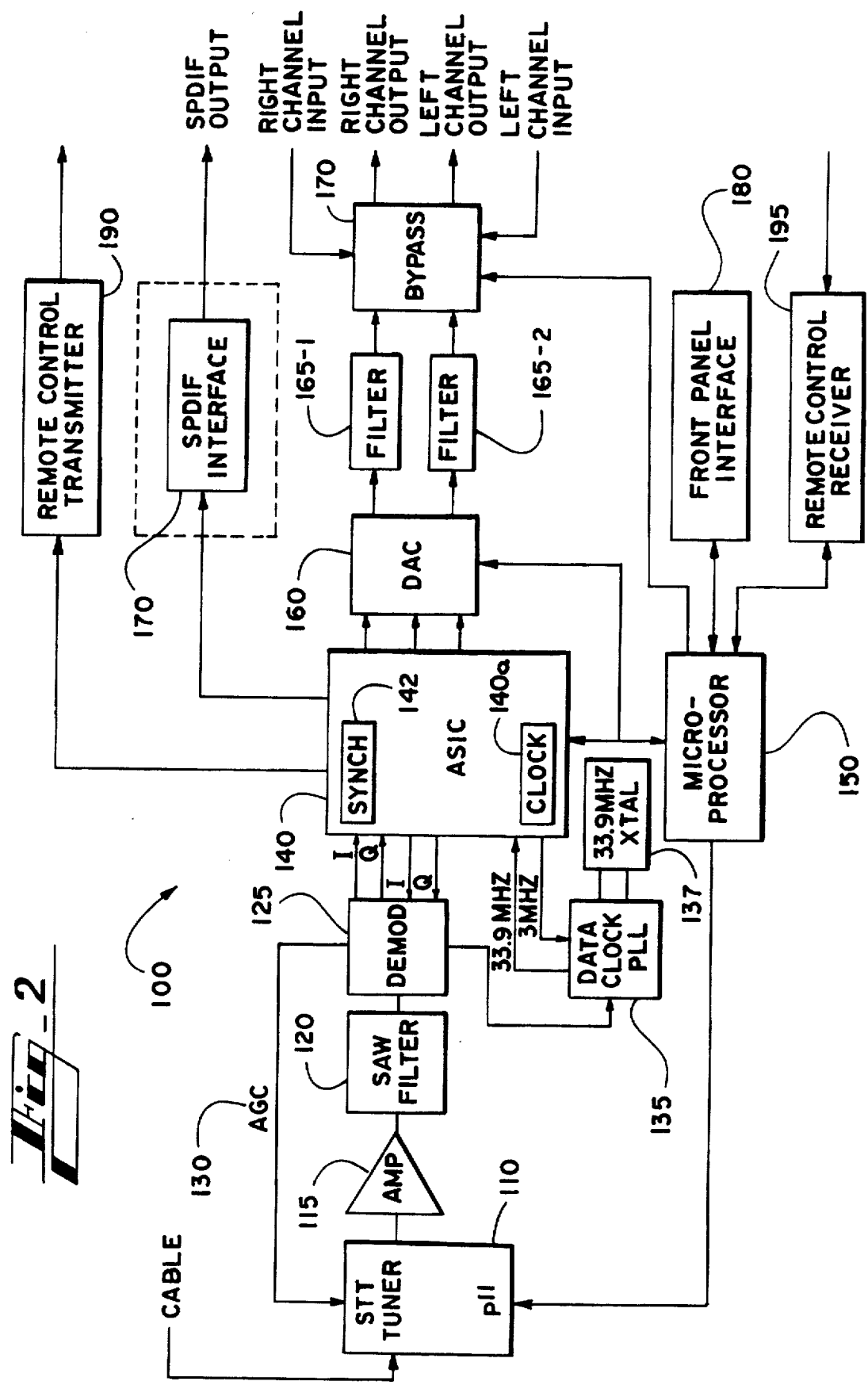

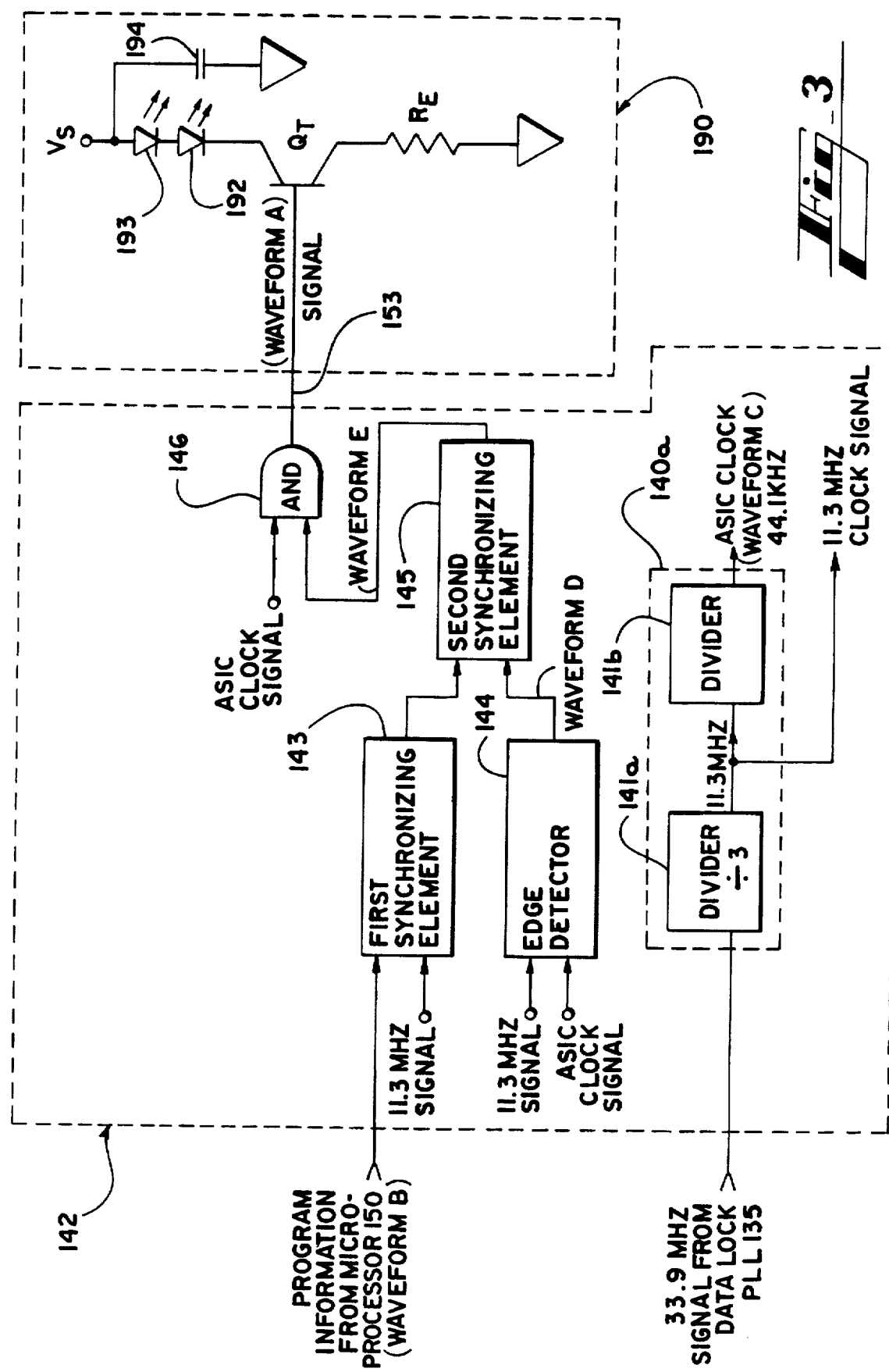

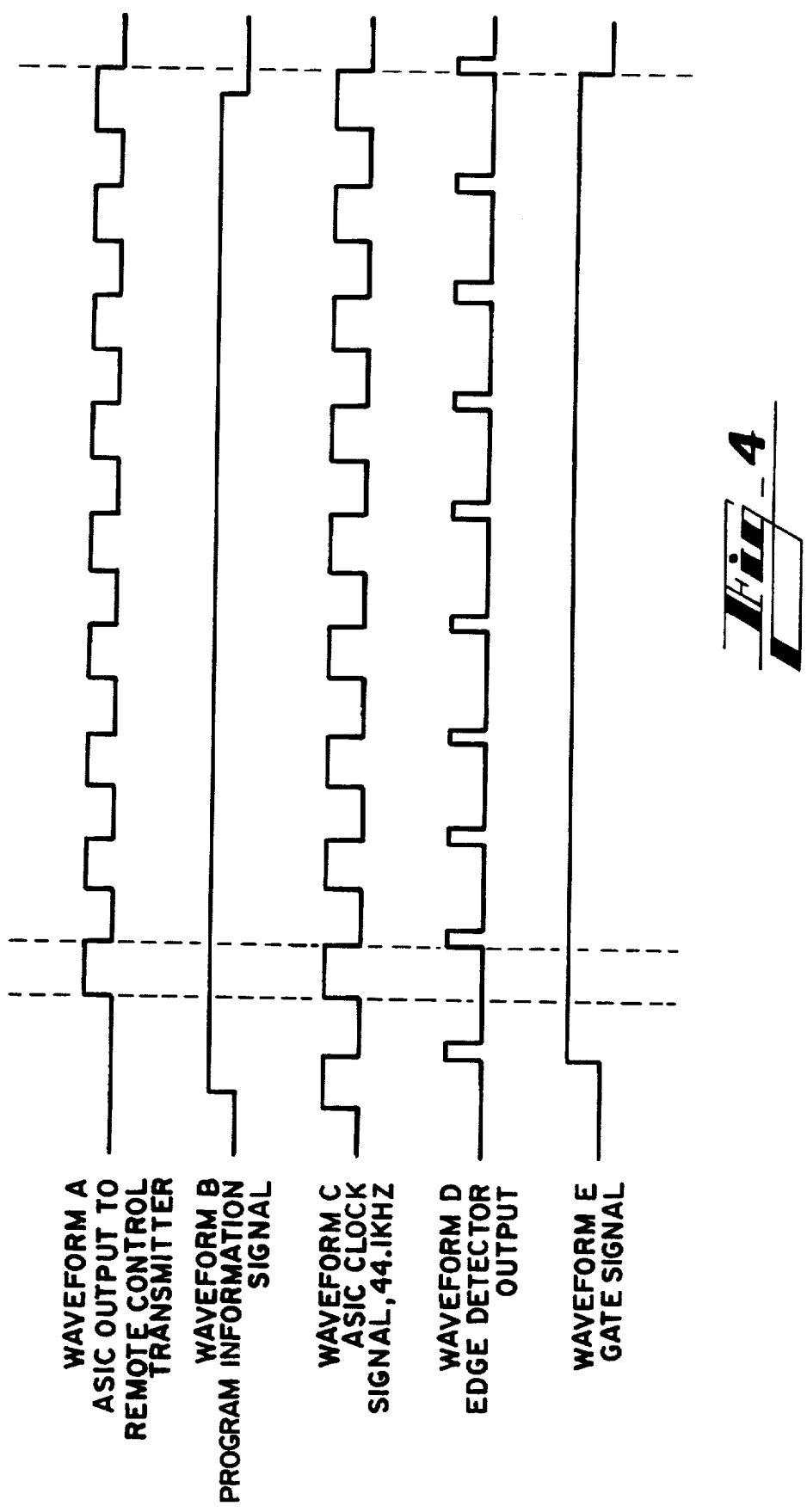

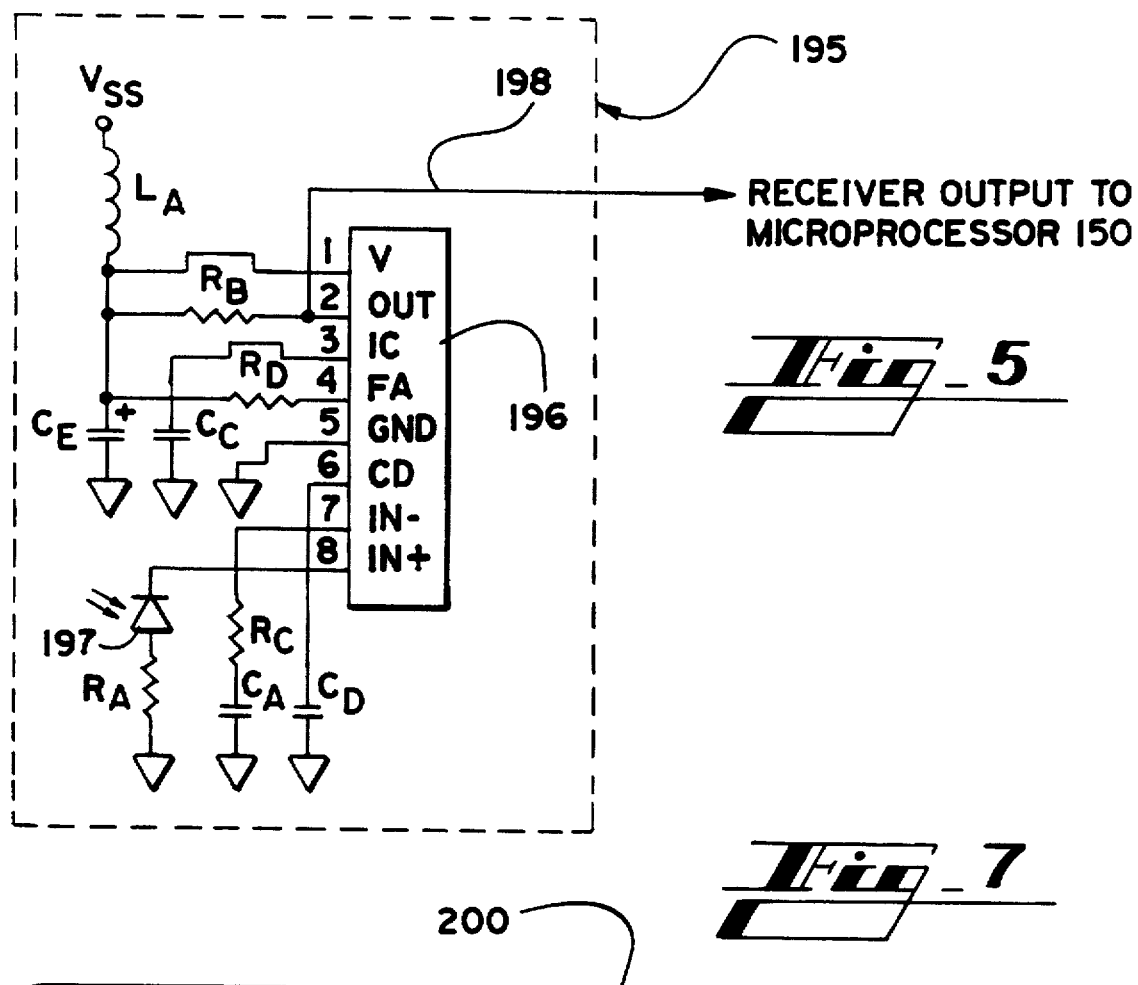
Fig_5
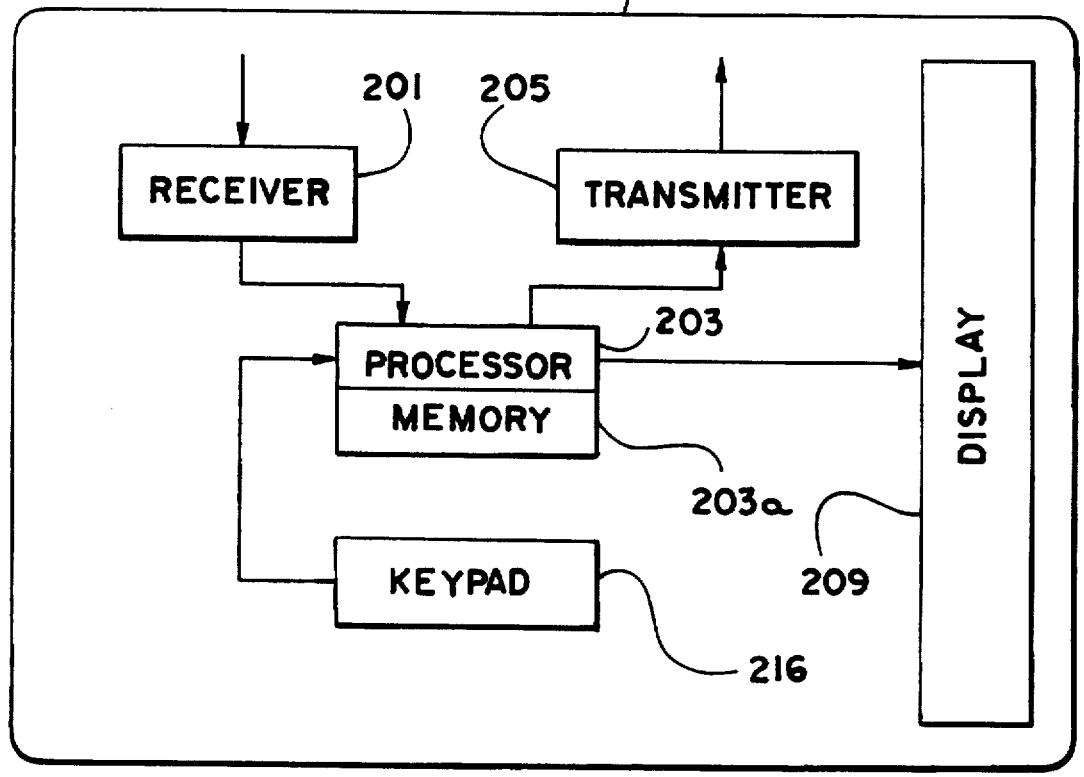
Fig_7

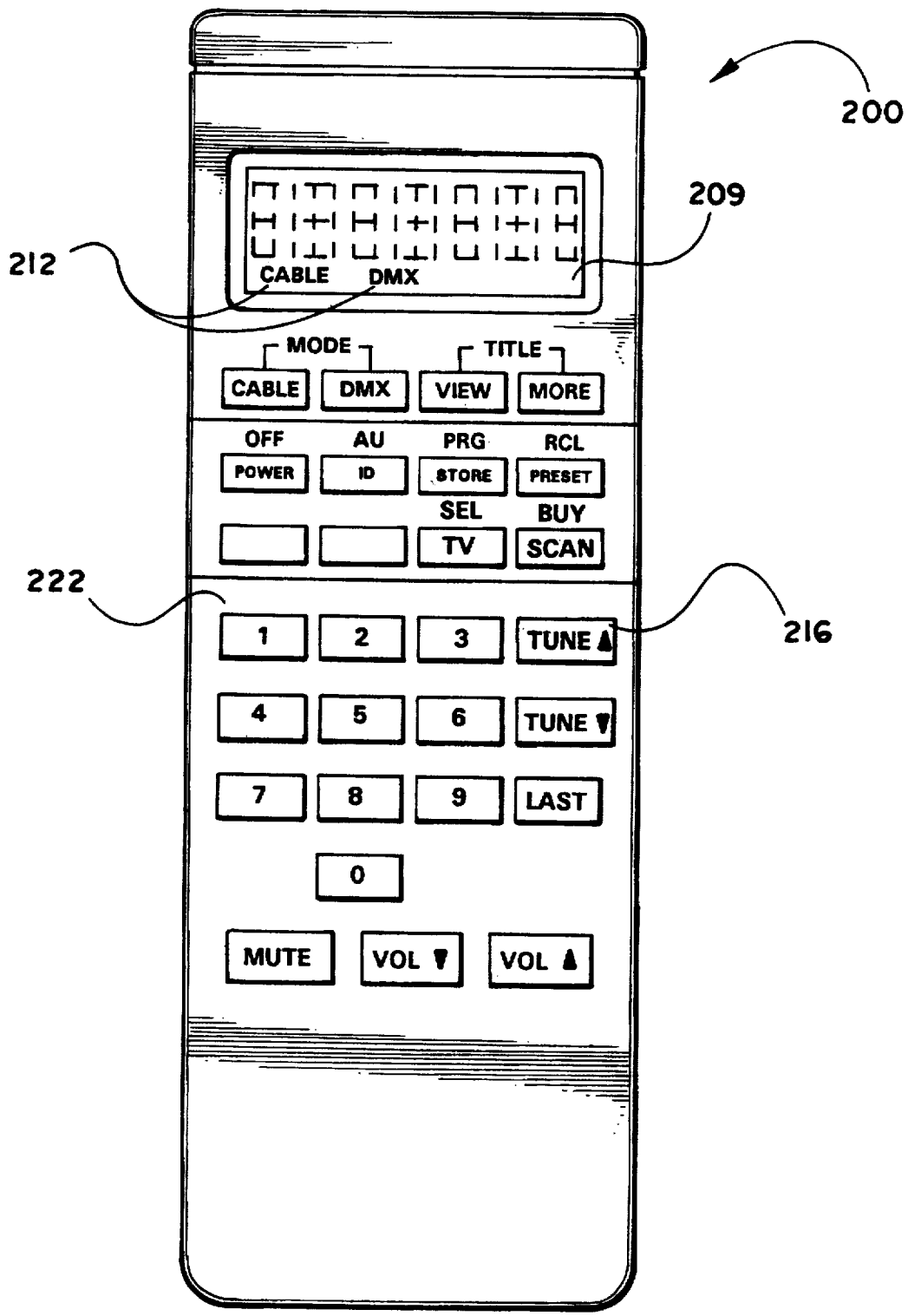
Fig_6

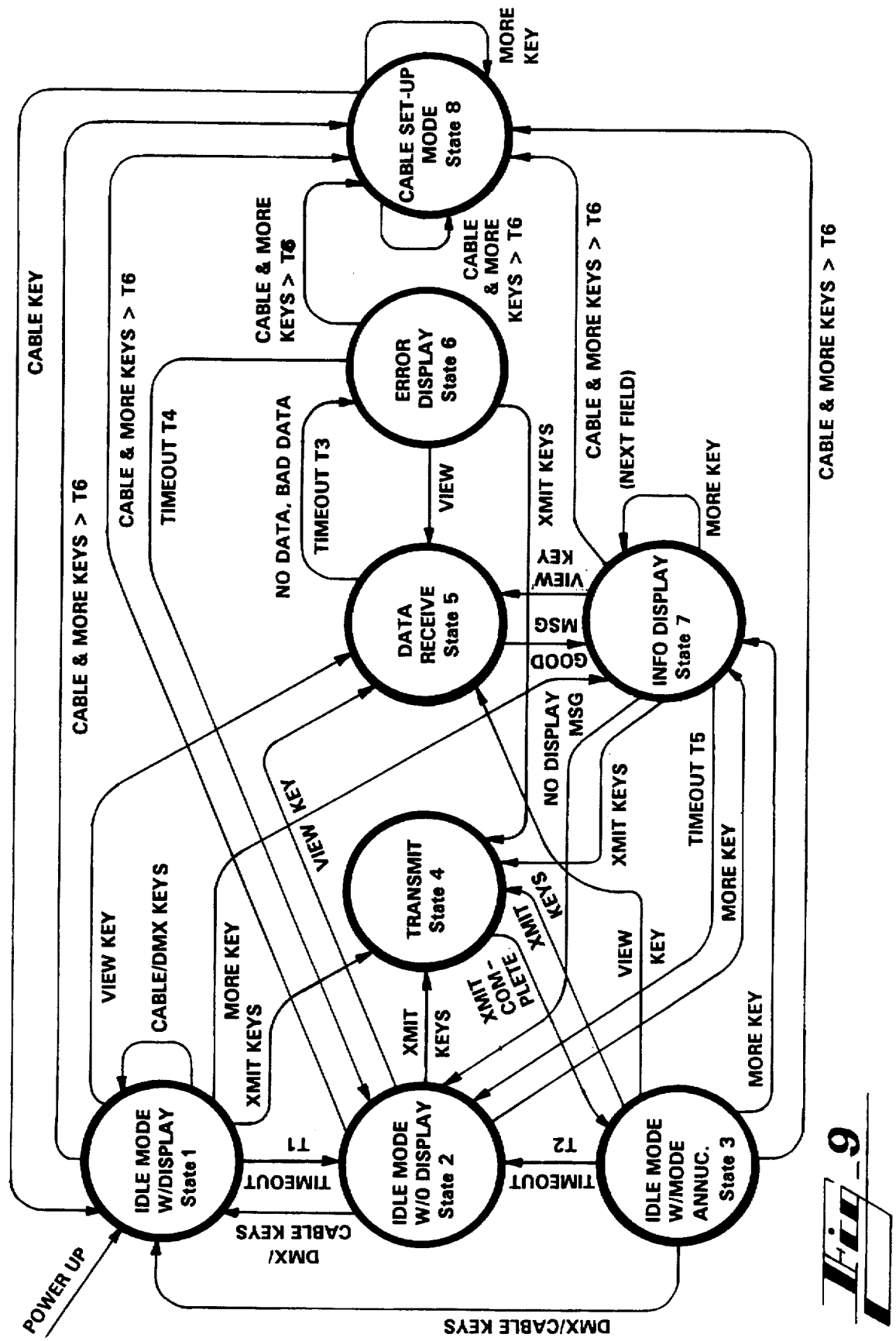
Fig_9

| State Description | Idle Mode W/ Display | Idle Mode W/O Display | Idle Mode W/Mode Annuc. | Transmit State |
|---|---|---|---|---|
| STATE NUMBER | 1 | 2 | 3 | 4 |
| TEXT DISPLAY | CABLE or DMX mode Information | None | None | None |
| ANNUNCIATORS | DMX or CABLE | None | DMX or CABLE | DMX or CABLE |
| CABLE KEY | Set CABLE mode, go to STATE 1 | Set CABLE mode, go to STATE 1 | Set CABLE mode, go to STATE 1 | No keys allowed during Trans. |
| DMX KEY | Set DMX mode, go to STATE 1 | Set DMX mode, go to STATE 1 | Set DMX mode, go to STATE 1 | No keys allowed during Trans. |
| VIEW KEY | Go to STATE 5 | Go to STATE 5 | Go to STATE 5 | No keys allowed during Trans. |
| MORE KEY | Go to STATE 6 | Go to STATE 6 | Go to STATE 6 | No keys allowed during Trans. |
| ALL OTHER KEYS (XMIT KEYS) | Go to STATE 4 | Go to STATE 4 | Go to STATE 4 | No keys allowed during Trans. |
| TIME OUT | After 2 seconds, go to STATE 2, T1 | None | After 0.5 seconds, go to STATE 2, T2 | None |
| BAD OR INCOMPLETE MESSAGE | N/A | N/A | N/A | N/A |
| GOOD MESSAGE | N/A | N/A | N/A | N/A |
| EMPTY MESSAGE | N/A | N/A | N/A | N/A |
| TRANSMISSION COMPLETE | N/A | N/A | N/A | Go to STATE 3 |
| CABLE & MODE KEYS > T6 | Go to STATE 8 | Go to STATE 8 | Go to STATE 8 | No operation |

Fig_10A

MATCH LINE TO FIG. 10B

| Data Receive State | Error Display State | Information Display State | Cable Set-up Mode |
|---|---|---|---|
| 5 | 6 | 7 | 8 |
| RETRIEVING DATA | 1) ERROR PLEASE TRY AGAIN  2) NO DATA RECEIVED PLEASE TRY AGAIN  3) NO DATA AVAILABLE | Display current field of information | Display current set-top selection |
| DMX or CABLE | DMX or CABLE | MORE only if unviewed fields available | CABLE |
| No operation | Set CABLE mode, go to STATE 1 | Set CABLE mode, go to STATE 1 | Go to STATE 1 (lock in selection) |
| No operation | Set DMX mode, go to STATE 1 | Set DMX mode, go to STATE 1 | No operation |
| No operation | Go to STATE 5 | Go to STATE 5 | No operation |
| No operation | No operation | Move pointer to next field, go to STATE 7 | Go to STATE 8 (display next choice) |
| No operation | Go to STATE 4 | Go to STATE 4 | No operation |
| No data after 2 seconds, go to STATE 6, Message 2, T3 | After 5 seconds, go to STATE 2, T4 | After 10 seconds, go to STATE 2, T5 | After 10 seconds, go to STATE 2, T5 |
| Go to STATE 6, Message 1 | N/A | N/A | N/A |
| Go to STATE 7 | N/A | N/A | N/A |
| Go to STATE 6, Message 3 | N/A | N/A | N/A |
| N/A | N/A | N/A | N/A |
| No operation | Go to STATE 8 | Go to STATE 8 | Go to STATE 8 |

MATCH LINE FROM FIG. 10A

Fig_10B

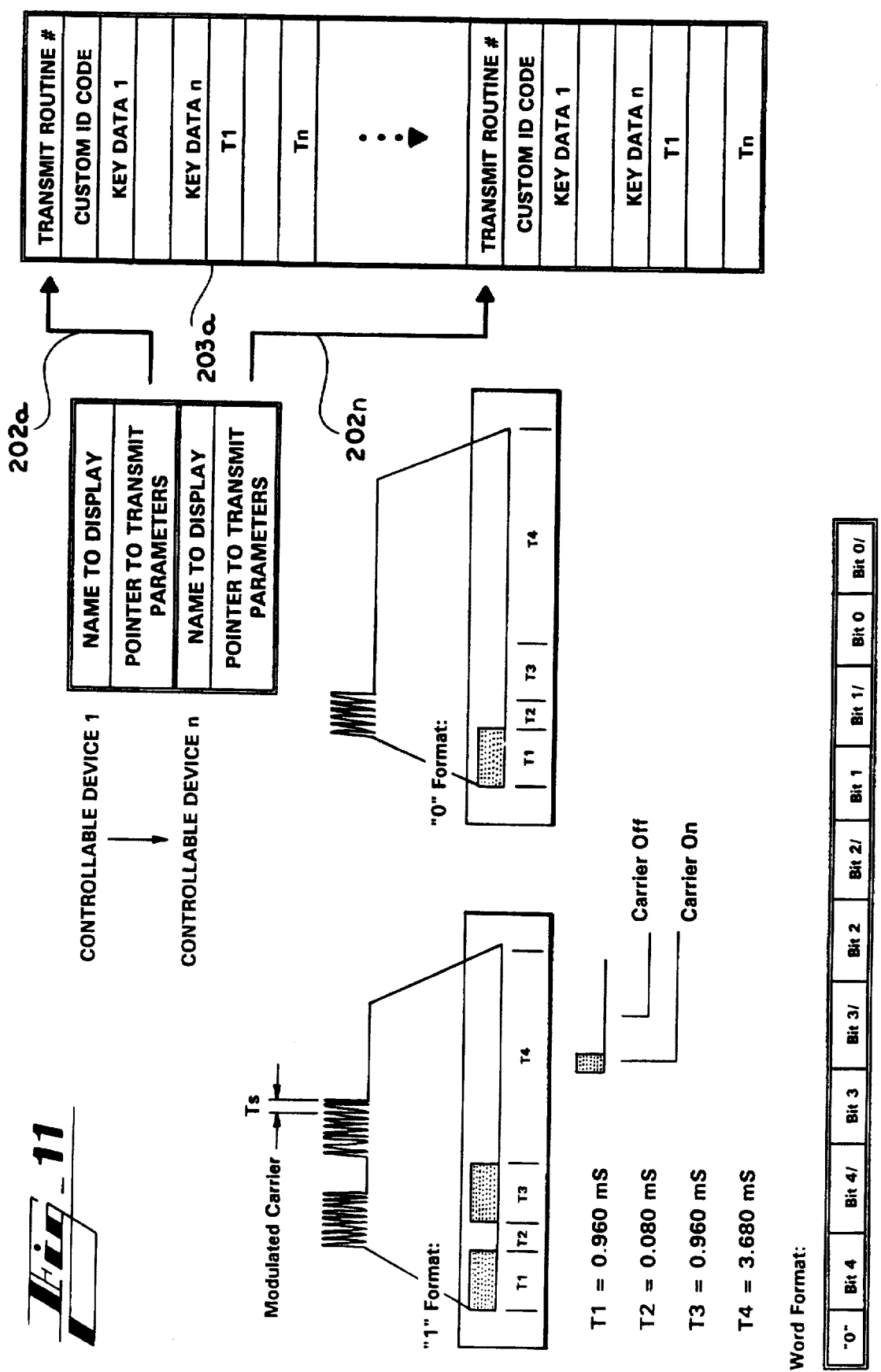

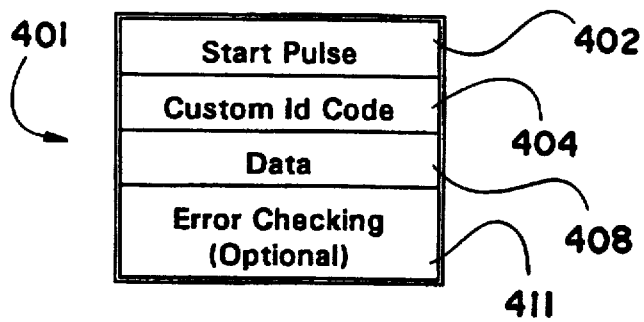
| | |
|---|---|
| STX | <STX> |
| SEQUENCE # | <Seq. #> |
| DEFINITION FIELD | <Def. field 1> |
| DATA FIELD - CH 0 | <Data field 1> |
| CRC7 | <CRC-7 field 1> |
| DEFINITION FIELD | • |
| DATA FIELD - CH 0 | • |
| CRC7 | • |
| DEFINITION FIELD | • |
| DATA FIELD - CH 0 | • |
| CRC7 | • |
| DEFINITION FIELD | • |
| DATA FIELD - CH 0 | • |
| CRC7 | • |
| DEFINITION FIELD | <Def. field 5> |
| DATA FIELD - CH 0 | <Data field 5> |
| CRC7 | <CRC-7 field 5> |
| EOT | <EOT> |
| CRC7-ALL | <CRC7-ALL> |
| ETX | <ETX> |
Fig_14
501

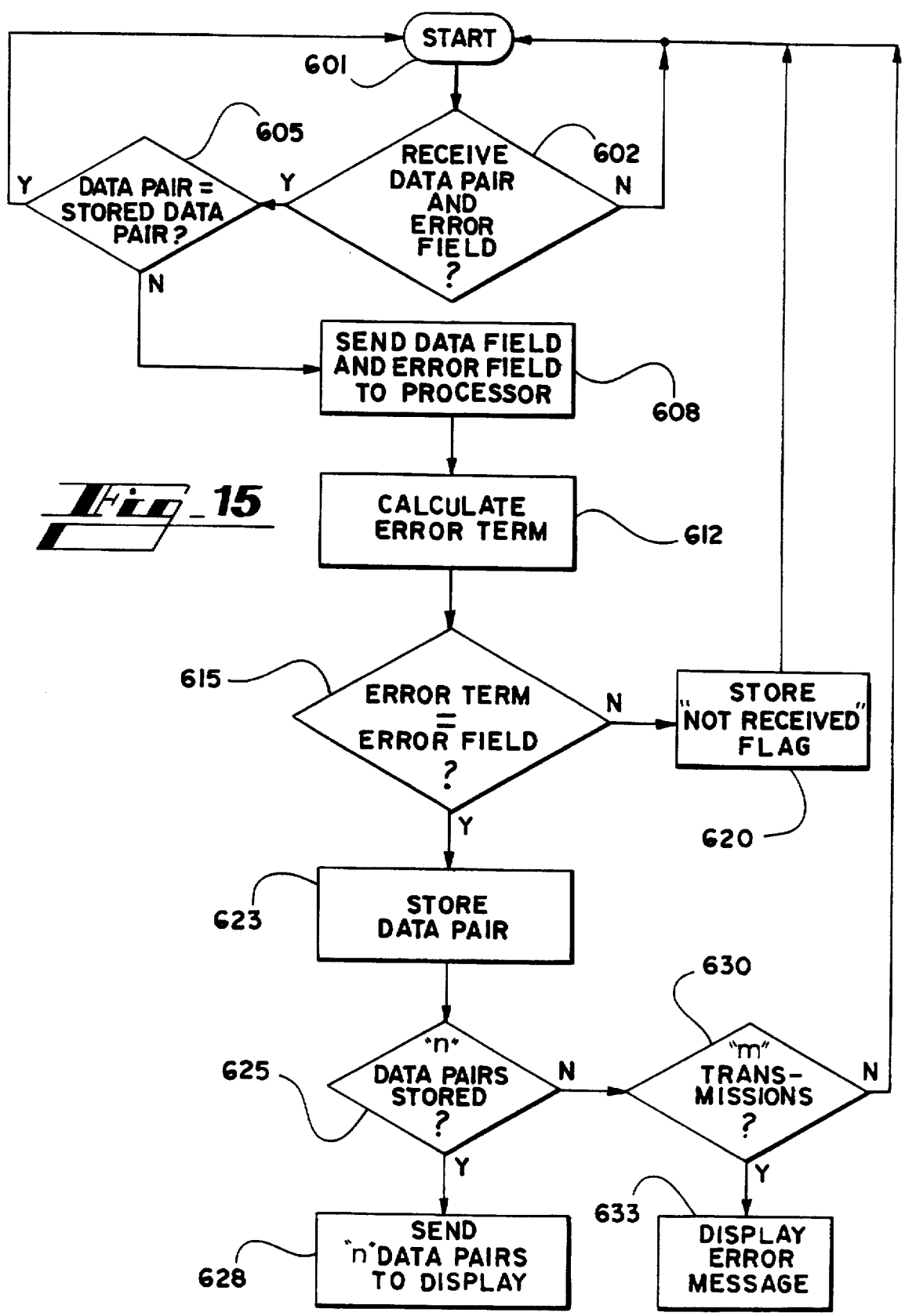

METHODS AND APPARATUS FOR COMMUNICATION PROGRAM DATA SIGNALS VIA A REMOTE CONTROL UNIT

This application is a division, of application Ser. No. 07/795,888 filed Nov. 19, 1991 now abandoned, which is a continuation-in-part of application Ser. No. 618,794, filed Nov. 27, 1990 now U.S. Pat. No. 5,239,540.

TECHNICAL FIELD

The present invention generally relates to a remote control systems, and more particularly, to a hand held remote control unit for communicating with a first controlled device by using a first communications protocol and control either a first controlled device or a second controlled device by using a selected second communications protocol and, furthermore, that displays program information associated with a program for the convenience of listeners/viewers as they are listening/viewing the program.

BACKGROUND OF THE INVENTION

Presently, program content information, for example, song title, artist, record label, etc., is communicated to the customer/listener by announcers or disc jockeys (DJs). In the case of video programs transmitted by broadcast means, video text messages are presented between programs and during interruptions of programs. In the case of many premium services, it is undesirable to interrupt programs for presentation of program content information. It may also be undesirable to have any form of announcer or DJ between programs or selections of music.

The announcers or interruptions of a program may be undesirable in some services. Nevertheless, it is highly desirable to communicate program content information. Frustration of customers, and possible loss of revenue due to subscription cancellation can occur if a subscriber has no method of knowing the title, composer, or artist of the particular selection of music. To the music industry, identification of the recording label and the musical selection is critical to the sale of recordings. Currently, a subscriber viewing a premium video program must consult a separate listing, tune to a different channel, or wait till the end of the program for its identification.

Similarly, the cable television industry is currently introducing audio-only services. Program content information is printed in a separate listing. These cable "radio stations" may play a continuous succession of musical selections without commercial interruptions. These services may not use a "disc-jockey" to identify the musical or other selections.

It can be a frustrating experience to enjoy a piece of music provided by an entertainment service, only to have the service provider fail to identify the piece. To lovers of music, having such information as music title, composer, artist and record label is vital. Without this information, the service will be reduced to the level of generic background music.

Indeed, the prior art has recognized the requirement to communicate program content information associated with a broadcast performance. U.S. Pat. No. 4,887,308 to Dutton describes an information broadcasting system that provides a radio listener with program information concerning the song and the performing artist for a broadcast performance. A primary storage information system stores program information associated with a broadcast performance. During the broadcast performance, a portion of the stored program information is selected and encoded for introduction to the standard programming information being broadcast by a broadcast transmitter. A separate receiver, typically an AM/FM radio, receives the broadcasting signals, including the encoded program information, transmitted by the broadcast transmitter. When a listener hears a performance of interest, the listener manually actuates a processor, which is coupled to the receiver, to introduce the selected program information associated with the performance into a memory. At a later time, the listener can retrieve the selected program information from the memory for presentation by a visual display.

Likewise, an article entitled "Digital Signal Accompanies FM Broadcast To Give Station Information To The Listener," published in *Electronics*, Volume 51, No. 21, dated Oct. 12, 1978, pages 68 and 70, describes a circuit for FM receivers that demodulates a program information signal, which is transmitted with a regular broadcast signal, to provide a visual display of tuning information, including the identification of a tuned station, the station's location, and the type of music being broadcast by the tuned station.

Common to both the Dutton and the *Electronics* systems is the use of a display to communicate program information associated with a performance to a listener and thereby, in essence, provide the function of a DJ for the convenience of the listener. Such a visual display could be built into the receiver itself, as described by the prior art, or it could be a separate display unit that would connect to an interface port of the receiver.

The problem with such displays is that, unless they are very large and therefore costly, they cannot be easily placed within reading distance of the listener. Long cables for the display would be difficult to route in a typical living room, and one need only look at the lack of success of video cassette recorder (VCR) wired remote controls to convince oneself that such a tethered display would not be optimum.

In contrast, wireless remote controls have brought great convenience to the control of consumer products. Highly intelligent remote controls with liquid crystal displays (LCD) are available. Programmable and universal "learning" remote controls are available that emulate the functions of multiple other controls. A universal "learning" remote control typically receives control code information from another remote control unit during a learning mode and displays the control functions available to the user.

Examples of such universal learning remote controls include U.S. Pat. No. 4,623,887 to Welles and related U.S. Pat. No. 4,626,848 to Ehlers, and U.S. Pat. No. 4,856,081 to Smith. Welles, Ehlers, and Smith describe reconfigurable remote control systems that include an infrared (IR) transmitter for transmitting a control signal with a defined transmission protocol, a receiver for receiving the control signal from a separate remote control system during a learning mode, and a display to indicate operational status and to prompt the user to input instructions during control operations and the learning mode. The typical transmission protocol for such IR remote control transmitters is defined by the number of pulses within a signal burst and the time period of each pause between pulses. A logic 1 is typically defined by a first pulse count within a predefined time period and a logic 0 is typically defined by a second pulse count within the predefined time period. Accordingly, the pulse count and the pause duration data define the transmission protocol for the transmitted control signal.

Many typical wireless remote control system, such as the programmable and universal learning remote controls described above, do not include a separate receiver to receive information from the device under control because such control systems only transmit a coded control signal at a relatively slow data rate of 50–100 baud. In general, such prior art systems do not provide for a two-way communications link between the remote control and the controllable device, nor do many remote controls receive and display any information obtained from the device under control. In addition, many remote control systems do not utilize an error detection system for the detection of an inaccurate transmission because such systems transmit the control signal at a relatively slow data rate, thereby eliminating any requirement for an error detection system. Consequently, a requirement exists for a remote control system that communicates with the device under control to provide a hand-held electronic DJ display for receiving a program information signal at a rapid data rate and for displaying such program information associated with a program selection for the convenience of a listener and, furthermore, which is capable of controlling a group of controllable devices.

Such a remote control would require a higher data rate for communications than the typical universal remote control because of the increased quantity of data, specifically program information data, provided to the remote control by the controllable device. In view of the increased quantity of data suggested by the communication of program information, an error detection scheme is also necessary to insure the accuracy of the data received by the remote control. Furthermore, to avoid the requirement for multiple remote control systems associated with a set of controllable consumer systems, a listener would benefit from the convenience provided by a wireless remote control system that includes a display for program information and, furthermore, operates to control multiple controllable devices.

SUMMARY OF THE INVENTION

The problems of transmitting and providing a display of program information associated with an entertainment service, as well as controlling a group of controllable devices, are solved by the principles of the present invention. The present invention ensures that a listener/viewer will continue to enjoy the convenience offered by use of a hand-held remote control unit, while also benefitting from a remote display that communicates program information, by combining a hand-held display of program information with a remote control unit that communicates with and controls a first controlled device, such as a music tuner, and a second controlled device, such as a community antenna television (CATV) set-top converter.

A system constructed in accordance with the present invention receives a program information signal at a rapid data rate to provide the listener/viewer with a display of the information on the remote control's display within a short period of time and, furthermore, controls selected functions of the controlled devices by transmitting a coded control signal at the more conventional, relatively slow data rate. In addition, the present invention utilizes an error detection process to ensure accurate reception of the program information.

Briefly described then, the present invention provides a system, including a hand held remote control unit with display, for communicating with a first controlled device, such as a digital music tuner connected to the CATV cable, and for controlling either the first controlled device or one of a group of second controlled devices, such as a CATV set top cable converter unit, television receiver, or the like. A first or "display information" communications protocol is associated with communication with the first controlled device, and at least one second or "control" communications protocols is associated with the control of the first controlled device and/or a selected one of the second controlled devices. In the preferred embodiment, the remote control unit is operative to retrieve protocol parameters from a memory corresponding to a selected controllable device in response to receipt of a command signal, and generate an appropriately formatted control signal for the selected device.

Communications between the remote control unit and the controlled devices are effected with a "protocol", that is, a formal set of conventions governing the format and relative timing of message exchange between the devices, in a manner as contemplated by the IEEE Standard Dictionary of Electrical and Electronics Terms (3rd. 1984). Different protocols are utilized in the present invention to facilitate different goals—a high speed, substantially-error free infrared (IR) carrier display information protocol (a first protocol) is utilized between a device providing program content information or the like, such as a music tuner, and the remote control unit (which preferably includes a LCD display), to facilitate prompt and error free display of the information to the user. A slower, more conventional control protocol (a second protocol) is utilized to provide for transmission of infrared (IR) control signals from the remote control unit to one or more controlled devices such as CATV-connected music tuner or CATV-connected set-top units. Thus, different first and second communications protocols are utilized in the preferred embodiment.

A benefit of having the display located within the hand herd remote control unit is that the cost of the display need not be included within the cost of the controlled device, for example, a separate display need not be provided on the music tuner. Indeed, the display can be a value-added, extra-cost feature for optional purchase by the user. It can thus be seen as a means of increasing revenue, or of making an entertainment service affordable to those not desiring the remote control feature.

More particularly described, the present invention is an improved, hand held remote control apparatus for communicating with and selectively controlling at least one remotely located device, the remotely located device being operative to carry out a controllable function upon receipt of a command delivered by a control signal from the remote control. apparatus. A receiver means is responsive to a display information signal transmitted by the remotely located device. The display information signal is of a substantially higher data rate than the control signal. A display means displays the display information signal in alphanumeric characters.

A keypad receives an operator input corresponding to a selected command for delivery to the remotely located device and provides a command signal. A transmitter means responsive to the command signal transmits a control signal corresponding to the selected command to the remotely located device.

In the disclosed embodiment, the remotely located device comprises a music tuner connected to a CATV cable, and the display information signal comprises a program information signal associated with music being provided on the CATV cable. The program information signal includes title information, track information, and artist information associated with music being provided on the CATV cable.

The disclosed remote control apparatus further includes control means operative for receiving the display information signal from the receiver means, generating display signals for the display, generating the command signal in response to actuation of an operator input on the keypad, and controlling the transmitter to transmit the control signal.

The display information signals include coded information signals and uncoded information signals. A memory means stores display signals associated with each of a plurality of coded information signals. The control means is responsive to the coded information signals for retrieving selected display signals from memory and for generating corresponding display signals for the display.

The coded information signals correspond to a plurality of predefined data categories to be displayed on the display means. The uncoded information signals correspond to particular items of data within a predefined data category to be displayed on the display means. The display is operative to display predetermined alphanumeric characters corresponding to the coded information signals, prior to displaying alphanumeric characters corresponding to the uncoded information signals.

The display information signal comprises an alphanumeric character information protocol signal for transmitting rapid error-free alphanumeric characters at a rate substantially in excess of the control protocol signal. In the disclosed embodiment, the display information signal is about 4900 baud, and the remote control protocol signal is less than about 100 bits per second.

A typical control signal comprises a predetermined remote control protocol for controlling one of a plurality of second remotely located devices. The second remotely located devices are typically infrared signal controlled and include a CATV cable-connected music tuner, a CATV cable-connected set top converter, a videocassette recorder (VCR), or a television receiver.

A memory stores a plurality of protocol parameters associated with different second or control protocols corresponding to different ones of the second remotely located devices. Means responsive to selection of a particular one of the second remotely located devices via the keypad means are provided for selecting particular ones of the plurality of protocol parameters. Means responsive to selected particular ones of the plurality of protocol parameters provide a corresponding control signal to the remote control unit's infrared transmitter.

In particular, a remotely located device comprises a music tuner connected to a community antenna television (CATV) cable, and a controllable function comprises the retrieval of program information being provided on the cable to the music tuner. The display information signal comprises alphanumeric information associated with the program information for display on the display means. The display means is preferably a separate display on the remote control unit for providing a nonintrusive display of information corresponding to the display information signals..

In the preferred embodiment, the music tuner transmits a display information signal to the remote control unit in response to a particular command or polling signal transmitted by the remote control unit. In this manner, a two-way communications link is formed between the tuner and the disclosed remote control unit. Alternatively, the tuner could transmit the information signal to the receiver in the absence of any polling by the remote control unit.

During a second operation mode, the display provides the user with a menu of codes associated with a group of CATV set top converters or television receivers. Each code provides a unique identifier for a selected CATV converter set-top. In this manner, the user can utilize the combination of the display and the selection system to select a converter set-top or television receiver identified by the menu.

In addition to the aspects described above, the present invention also provides a system for displaying program information derived from an information signal associated with at least one digital data signal, wherein the system includes a first device and a second device remotely located from the first device. The first device includes a first receiver for receiving an encoded signal from a signal source, for example, digitized music encoded in the CD format. The encoded signal includes the information signal and the digital data signal, wherein the digital data signal is provided at a first clock frequency. In response to the encoded signal, a first processor separates a selected information signal from its corresponding digital data signal to produce a separated information signal. The first device further includes a clock oscillator that provides a signal at the first clock frequency and a transmitter for transmitting the separated information signal at the first clock frequency.

Instead of utilizing another clock frequency associated with separate clock oscillator to transmit the separated information signal for display at the remote control unit, the preferred first device utilizes derives a clock from the digital data CD music data signals for generating a signal at a frequency for IR signal transmission of the information for display. Consequently, the cost of a separate clock oscillator is not included within the total expense for the first device. Furthermore, the use of the existing clock oscillator benefits the mechanical and electrical layout for the first device by eliminating a separate clock component that would otherwise be required to provide the same clock signal function.

The second device includes a second receiver for receiving the transmitted information signal and producing a received information signal. The second device further includes a display for communicating the received information signal. In this manner, the second device communicates information derived from the selected information signal that is associated with its corresponding digital data signal. The digital data signal could take the form of a digital audio signal encoded at the first clock frequency. However, the digital data signal could also be a digital video signal encoded at the first clock frequency. For the digital audio signal, the first clock frequency is defined as 44.1 kHz to insure compatibility with the frequency standard for Compact Disc (CD) technology as defined by the Sony-Phillips digital interface format (SPDIF).

The second device could further include a second transmitter that transmits a particular control command signal to the first device and thereby prompt the first device to transmit the separated information signal in response to the information request signal. The first device, such as a base subscriber terminal for a CATV digital music channel, transmits an information signal to the second device, such as a remote control unit, in response to the remote control unit polling the base subscriber terminal by transmitting the appropriate control command signal. However, the first device could also transmit the information signal to the second device in the absence of any polling activity by the second device. Accordingly, a two-way communications link is formed between the base subscriber unit and the remote control unit. This communications link could include infrared, radio frequency, visible light, acoustical transmission through air, or other wireless communications means.

The second transmitter also transmits another control command signal to the first device to initiate a selected control function associated with the first device. In this manner, the second device controls selected operating functions of the first device by transmitting a control command signal corresponding to a selected control function. The first receiver receives the particular control command signal and provides the received control command signal to the first processor. Subsequently, the processor initiates the selected control function in accordance with the control command.

Yet still more particularly described, the present invention provides a method for receiving an entire, error-free message from a predetermined number of transmissions of an encoded message, particularly useful for accumulating a message for display on the remote control unit. The encoded message, which is defined by a predetermined number of data fields, is communicated by a transmitter to a receiver. At the receiver, one of the data fields is received and subsequently checked for an error associated with the received data field to determine if it is error-free. If the received data field is error-free, the received data field is stored as an error-free data field. The steps of receiving one of the data fields, checking the received data field, and storing the error-free data field are repeated for subsequent transmissions of the message until each of the predetermined number of data fields is stored as an error-free data field.

Stated in still other words, the present invention further provides a method for receiving an entire, error-free message for a predetermined number m of transmissions of an encoded message. Similar to the above-described method, the message, which is defined by a predetermined number of data fields, is communicated by a transmitter to a receiver. The method includes receiving one of the data fields during the first transmission of the encoded message and checking for an error associated with the received data field to determine if it is error-free. If the received data field is error-free, the receive data field is stored as an error-free data field.

Alternatively, if the receive data field is not error-free, the steps of receiving one of the data fields and checking for an error associated with the received data field are repeated for subsequently received data fields associated with the first transmission of the message and, furthermore, an error flag indicating that a particular one of the data fields has not been received as error-free is stored upon the detection of such an error. The error-checking process is repeated for subsequent transmissions of the message until all of the data fields have been stored as error-free data fields or, alternatively, the mth transmission of the message has occurred.

Specifically, the above-described steps are repeated only for the particular data fields associated with the error flag. In this manner, subsequent receptions of particular data fields that have been stored as error-free are ignored to eliminate unnecessary error-checking and, consequently, reduce the time associated with the method of checking for errors within an entire message.

In furtherance of these principles, it is an object of the present invention to provide an improved remote control system that communicates with a first device by use of a first communications protocol and controls the first device or a selected one of a group of second control devices by use of a separate second communications protocol.

It is a further object of the present invention to provide an improved two-way communications link between a remote control unit and a controllable device.

It is a further object of the present invention to provide an improved remote control unit having a display to communicate information received from a controllable device, in response to the remote control unit transmitting an information request to the controllable device.

It is a further object of the present invention to effect a rapid transfer of program information between a controllable device and a remote control unit having a display.

It is a further object of the present invention to effect an error-free communication of program information between a controllable device and a remote control unit.

It is a further object of the present invention to utilize an existing clock oscillator having a predefined frequency within a first device to enable the transmission of program information to a second device using the predefined frequency to generate an infrared signal carrier signal.

It is a further object of the present invention to transmit program information, corresponding to a selected digital audio signal, at a predefined frequency, where the selected digital audio signal is provided at the predefined frequency.

It is a further object of the present invention to provide an error detecting or an error checking process for receiving an entire, error-free message from a predetermined number of transmissions of a message defined by a predetermined number of data fields.

BRIEF DESCRIPTION OF THE DRAWINGS

These and other advantages of the present invention may be appreciated from studying the following detailed description together with the drawings in which:

FIG. 1 is a overall block diagram of a system in which the preferred embodiment of the present invention is operative.

FIG. 2 is a detailed block diagram of the data signal receiver system utilized in the system shown in FIG. 1.

FIG. 3 is a block diagram of a synchronizing circuit utilized in the receiver shown in FIG. 2 to produce a infrared carrier signal used for transmitting a display information signal.

FIG. 4 is a diagram showing the waveforms produced by the synchronizing circuit of FIG. 3.

FIG. 5 is a schematic diagram of an infrared signal remote control transmitter associated with the receiver illustrated in FIG. 2.

FIG. 6 is a top plan view of a remote control unit constructed in accordance with the preferred embodiment of the present invention.

FIG. 7 is a schematic diagram of the preferred remote control unit shown in FIG. 6.

FIG. 9 is a state diagram illustrating the method of operation of the preferred remote control unit shown in FIG. 6.

FIGS. 10A and 10B are state tables associated with the state diagram illustrated in FIG. 9.

FIG. 11 illustrates a typical second or control communications protocol associated with the control of a selected controllable device by the preferred remote control unit of FIG. 6.

FIG. 13 is a diagram illustrating the preferred control communications protocol associated with a control command signal transmitted by the preferred remote control unit of FIG. 6.

FIG. 14 is a diagram illustrating the preferred display information communications protocol associated with program information received and displayed by the preferred remote control unit of FIG. 6.

FIG. 15 is a flow chart diagram illustrating the error-checking method carried out by the preferred remote control unit of FIG. 6.

DETAILED DESCRIPTION OF THE PREFERRED EMBODIMENT

Figure 8A:
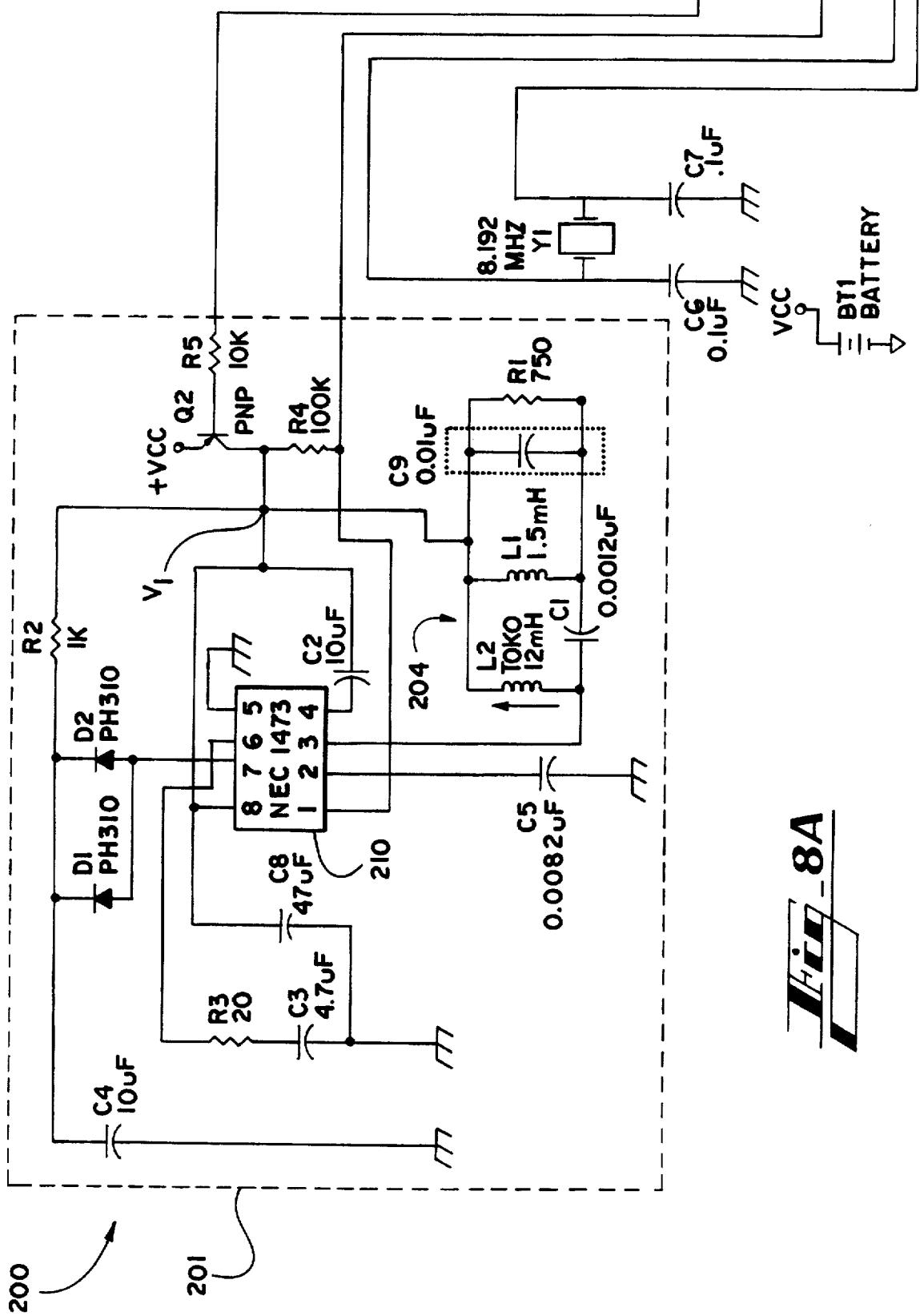
FIGS. 8A and 8B are schematic diagrams illustrating the circuitry of the preferred remote control unit shown in FIG. 6.

Referring to FIG. 1, a block diagram of an overall system 8 in which the preferred embodiment of the present invention is particularly suitable is illustrated. The present invention, preferably embodied in a remote control unit 200 that carries out the methods and functions described herein, will be described with respect to transmitting digital audio signals with program information. However, those skilled in the art will recognize that the present invention may, instead of transmitting audio with corresponding program information, transmit any of the following, with corresponding program information: television, games, software, video, and other combinations of audio/video or software information.

Overall System

Compact disc (CD) players 10-1 through 10-n provide a plurality of digital audio signals to the present invention. The CD players maybe the so called "jukebox" type wherein up to sixty or more compact discs may be stored and accessible by the player.

The digital audio signals from the CD players 10-1 through 10-n are. input to encoders 20-1 through 20-n. The controller and music databases 30-1 through 30-k controls each output of the CD players 10-1 through 10-n and any respective selection of compact discs within these players. The controller and music databases 30-1 through 30-k also provide a database containing program information with a one-to-one correspondence to the tracks contained on the compact discs. This program information includes title, track, artist, publisher, composers, song identification, and play time information blocks for each song contained on a compact disc.

These program information signals could also include other information relevant to describing the particular track contained on a compact disc, as those skilled in the art can appreciate. For example, if the information were historical audio data, information on the time and place such data was first conceived or transmitted also may be contained within this program information. Additionally, if the digital signals transmitted contained video information, the corresponding program information signals would relate to the video program being transmitted, for example, the title, actors, director, publisher, year, or other relevant information.

The plurality of digital audio signals inputted by the CD players 10-1 through 10-n are combined in the encoders 20-1 through 20-n with the program information signals inputted by the controller and music databases 30-1 through 30-k. The combined signals from the encoders 20-1 through 20-n are then inputted into a multiplexer 40 which combines the signals into a serial digital data stream.

Additional signals may be combined with the digital audio and program information signals. A subscriber control 45 contains information on various subscribers who may receive the digital audio data produced by the present invention. This subscriber information stored in the subscriber control 45 is multiplexed with the digital audio and program information signals in the multiplexer 40, producing a serial digital data stream containing digital audio, program information, and national subscriber information.

The serial digital audio/program information stream from the multiplexer 40 is input into a satellite transmitter 50 and broadcast, via satellite, to a satellite receiver 60. However, those skilled in the art will realize that any delivery system, not just satellite transmission, may be used, such as cable television, microwave distribution (MDS or MMDS), telephone systems, terrestrial broadcasts, and other coaxial or optical cable lines.

The satellite receiver 60 transfers the data to a headend processor 70, which in turn converts and sends the information to audio cable modulator 75, preferably a digital audio cable modulator. A local program origination system 73 also provides local program data, such as audio data originating from a local radio station, to the headend processor 70 for processing and conversion of the local program data prior to sending the local program data via a digital audio cable modulator 75 to a cable distribution system. CATV cable modulators 78 preferably accept video data from the headend processor 70 and modulates the video data for transmission over the cable distribution system. The digital audio data is then added with the video data from the CATV cable modulators 78 in a summing circuit 80 and a combined signal is sent over the cable distribution system.

Although analog video data is typically utilized by a conventional CATV system, those persons skilled in the art will appreciate that digital video data could also be input to the CATV cable modulators 78 for subsequent distribution over the cable distribution system. Furthermore, the headend processor 70 could also provide a video program information signal associated with the video data to the CATV cable modulator 78 and thereby introduce the video program information to the cable distribution network.

The cable distribution system includes line amplifiers 85 for boosting the signal and compensating for any line loss. A system tap 90 directs the combined signal of the digital audio data and the video data via the direct path of a coupler 90 to a subscriber's premises and into a first device, otherwise referred to as a first controlled device, which is preferably a digital music tuner (DMT) 100.

The digital music tuner 100, more fully described with respect to FIGS. 2–5, selects a channel containing the digital audio and program information signals. Additionally, the digital music tuner 100 separates the digital audio signal from the program information signal. The digital audio signal is converted to an analog signal, amplified, and output on a subscriber's audio electronics, while the program information signal is processed and sent to an optional local display or a second device, preferably a remote control unit 200 having a display. The selected display then communicates to the subscriber the particular program information corresponding to an audio track currently being listened to by the subscriber.

The coupler 93 further directs the combined signal of the digital audio data and the video data to a second controlled device, preferably a CATV set-top converter 300 located within the subscriber's premises. The CATV set-top converter 300 selects a channel of video data and processes the video data in a conventional manner appreciated by those persons skilled in the art to provide a processed video signal for viewing via a television receiver 310. If the video data is accompanied by a video program information signal associated with the video signal, then a CATV set-top converter having a video program information processor would separate the video signal from the video program information signal, process the video program information signal, and send the video program information to the television receiver 310 or to the remote control unit 200 for communicating the video program information to the subscriber.

The remote control unit 200 also is capable of controlling selected operating functions of both the tuner 100 and the set-top converter 300. At any one time, the remote control unit controls either the tuner 100 or a selected one of a group of set-top converters, such as the set-top converter 300, or other remotely controllable devices such as VCRs, television receivers, and the like.

The preferred remote control unit 200 is more fully described with respect to FIGS. 6–11.

Digital Music Tuner

FIG. 2 is a block diagram of the preferred digital music tuner 100. Referring to FIGS. 1–2, the digital audio and program information signal is received by the head end processor 70 and passed, via the cable distribution system and the system tap 90, into a set-top terminal tuner 110. The terminal tuner 110 preferably includes phase-lock loop (PLL) circuitry. The signal from the terminal tuner 110 is amplified by an amplifier 115 and filtered by a saw filter 120 before being demodulated by a demodulator 125. The terminal tuner 110 converts the selected radio frequency (RF) channel to a demodulation intermediate frequency (IF). The output of the demodulator 125 is quadrature partial response (QPR) demodulated to produce a 5.6 Mbps data stream containing five stereo pair of digital audio data to an applications specific integrated circuit (ASIC) 140. The demodulator 125 also provides an automatic gain control signal 130 to the terminal tuner 110 to maintain constant signal level. Additionally, the demodulator 125 provides data to a data clock recovery PLL 135. The data clock recovery PLL 135 contains a 33.8688 Megahertz (MHz) crystal 137 (about 33.9 MHz) for timing purposes.

The ASIC 140 provides demultiplexing, decrypting, and decoding operations upon the 5.6 Mbps data stream input by the demodulator 125. The ASIC 140 separates the 5.6 Mbps data stream to a select one of five stereo pairs of digital audio signals. The selected stereo pair is decrypted and separated to provide a program information signal and a digital audio data signal. The digital audio data signal is then decoded utilizing a data compression technique described in U.S. Pat. No. 4,922,537, incorporated herein by reference.

The ASIC 140 inputs the digital audio signals, provided at a sampling rate of 44.1 kHz, to a digital [to] audio converter (DAC) 160. From the DAC 160, analog left and right audio signals are filtered through filters 165-1 and 165-2 and input into a bypass 170. The bypass 170 allows additional audio components (e.g., a CD player or tape deck) to be switchably connected with the digital music tuner 100. A microprocessor 150 controls the PLL of the terminal tuner 110, ASIC 140, the DAC 160 and the bypass 170.

The program information signal from the ASIC 140 is sent to the microprocessor 150 where it may be displayed on a front panel interface 180. The ASIC 140 also sends the program information signal to a remote control transmitter 190 for transmission to the remote control unit 200.

A remote control receiver 195, coupled to the microprocessor 150, receives instruction or control signals transmitted by the remote control unit 200 to initiate the remote control of selected functions of the tuner 100.

A clock signal generated internal to the ASIC 140 is utilized as a carrier signal to switch the output of the remote control transmitter 190 ON or OFF at a frequency of 44.1 kHz. It will be appreciated that because the 44.1 kHz sampling clock for audio digital to analog conversion in the DAC 160 happens to be within the common operative frequency range for infrared signal carriers (which vary from about 20 kHz to about 60 kHz), the 44.1 kHz clock from an ASIC CLOCK generator 140a may be utilized to generate a carrier signal for infrared signals sent by the remote control transmitter 190. An ASIC CLOCK generator 140a therefore advantageously provides the clocking function for the DAC 160 (to convert the digital audio signals into analog audio signals), as well as the carrier signal function associated with signal transmissions by the remote control transmitter 190. If the ASIC CLOCK generator 140a did not serve such dual signal functions, separate clock oscillators would otherwise be required to provide the clock signal and the carrier signal functions, thereby increasing the overall cost and complexity of the tuner 100.

The remote control unit 200 operates to control selected functions of the tuner 100 and the selected CATV set-top converter 300, as well as to display the program information transmitted by the remote control transmitter 190 associated with the tuner 100. A two-way wireless communications link exists between the tuner 100 and the remote control unit 200. In contrast, a one-way wireless communications link exists between the remote control unit 200 and a conventional CATV set-top converter, such as the set-top 300.

Referring now to FIGS. 2-3, the ASIC clock generator 140a provides an ASIC CLOCK signal having a fixed first frequency to drive an interface 170, which provides digital audio data at the fixed frequency. The ASIC CLOCK signal has a fixed frequency defined by the standard Sony-Phillips digital interface format (SPDIF), 44.1 kHz, because the digital audio signals previously have been sampled at such a defined frequency and, in addition, the interface 170 uses the standard SPDIF digital interface format.

The ASIC CLOCK signal provided by the ASIC clock 140a is derived from the about 33.9 MHz signal provided to the ASIC 140 by the data clock PLL 135. Specifically, the ASIC CLOCK signal is derived by dividing the 33.9 MHz signal by three (3) to provide a second clock signal having a frequency of 11.3 MHz, and by then dividing the 11.3 MHz signal to the preferred fixed first frequency for the 44.1 kHz ASIC CLOCK signal. Dividers 141a, 141b provide these frequency dividing functions. The 11.3 MHz clock signal is utilized as a clock signal to drive selected operations conducted by the ASIC 140.

FIG. 3 shows a synchronizing circuit 142 utilized within the ASIC 140 to provide clock synchronized program information signals to the remote control transmitter 190. FIG. 4 shows the relationship between selected signals associated with the synchronizing circuit 142 in FIG. 3. In particular, the synchronizing circuit 142 operates to provide two separate timing alignment functions. First, the synchronizing circuit 142 aligns the program information signal provided by the microprocessor 150 to the 11.3 MHz clock signal. Second, the synchronizing circuit 142 aligns the 44.1 kHz ASIC CLOCK signal to the 11.3 MHz clock signal.

The synchronizing circuit 142 includes a first synchronizing element 143, an edge detector 144, a second synchronizing element 145, and an AND gate 146. Referring to FIGS. 3–4, the microprocessor 150 provides program information signals (waveform B) in the form of a serial data signal formatted in the appropriate display information protocol (described below) to the first synchronizing element 143. The microprocessor 150 outputs the program information signals to the first synchronizing element 143 at a predefined data rate, preferably 4900 baud. In addition, the 11.3 MHz clock signal is provided as another input to the first synchronizing element 143. The first synchronizing element 143 aligns the rising edge of the program information signals (waveform B) to the 11.3 MHz clock signal to provide an output signal synchronized with the 11.3 MHz clock.

The 11.3 MHz clock and the ASIC CLOCK signal of 44.1 kHz (waveform C) are input to an edge detector 144. As will be understood by those skilled in the art, an edge detector 144 is generally operative to provide a single clock pulse in response to detection of a rising edge or a trailing edge of an input signal. When the edge detector 144 detects a rising edge or a trailing edge of the ASIC clock signal (waveform C), it provides an output signal (waveform D) that enables the operation of a second synchronizing element 145. Specifically, the edge detector 144 outputs a narrow pulse that extends for one period of the 11.3 MHz clock signal as the output signal (waveform D). The preferred edge detector 144 detects a trailing edge associated with the ASIC CLOCK signal.

The second synchronizing element 145 accepts the synchronized output signal of the first synchronizing element 143 and produces a gate signal (waveform E) when the output signal of the edge detector 144 enables the second synchronizing element 145. In the preferred embodiment, the synchronizing elements 143,145 comprise well known digital circuits such as J-K flip-flop, cross-coupled NAND gates, D-type flip-flops, or the like.

The gate signal produced by the second synchronizing element 145 and the ASIC CLOCK signal of 44.1 kHz are provided as inputs to an AND gate 146. When the gate signal represented by waveform E is high, the AND gate 146 outputs an integral number of periods (or cycles) of the ASIC CLOCK signal. Accordingly, the integral number of cycles of the ASIC CLOCK signal output (waveform A) by the AND gate 146 is effectively determined by the pulse width or pulse duration of the gate signal output by the second synchronizing element 145.

It will now be understood that the output of the ASIC 140 is a carrier-modulated program information signal, produced by an on/off keying technique, and is provided from the the synchronizing circuit 142 on line 153 to the transmitter circuit 190. The carrier-modulated program information signal, when formatted with appropriate start bits, stop bits, and other formatting information described below, comprises a display information signal that is ultimately displayed as alphanumeric characters on the display of the remote control unit 200.

For the preferred data rate of the program information signal, 4900 baud, a logic one level for the program information signal corresponds to nine cycles of the ASIC CLOCK signal. In other words, the fixed data rate for the program information signal is defined by a ratio of the first frequency associated with the ASIC CLOCK signal to a selected one of an integral number of cycles of the first frequency per bit. For example, when the first frequency is determined by the SPDIF standard, 44.1 kHz, and the integral number of cycles per bit is defined as 9, then the data rate is fixed at 4900 baud. In this manner, the remote control unit 200 efficiently receives the transmitted program information signal from the tuner 100 with a minimum amount of jitter in the received signal. An integral number of cycles per bit is preferred to ensure the accurate reception of the transmitted program information signal by the remote control unit 200.

It will be appreciated from the foregoing that the transmitter 190 and synchronizing circuit 143 comprise a pulse code modulator that transmits the program information signal by gating a signal source corresponding to the program information signal with a gate signal at the first frequency. It will also be appreciated that the pulse code modulator provides a pulse code modulated (PCM) signal having a predetermined bit rate, and that the gate signal is the 44.1 kHz clock signal.

Still referring to FIG. 3, the remote control transmitter 190 is responsive to the carrier-modulated program information signal (waveform A) provided on line 153. The microprocessor 150 initiates a transmission of a program information signal by the tuner 100. In response to the initiation of a transmission, the ASIC 140 outputs the synchronized program information signal at the rate defined by the first frequency (44.1 kHz) to the remote control transmitter 190.

The output of the ASIC 140 on line 153 is connected to a base terminal of a transistor $Q_T$. An emitter terminal of the transistor $Q_T$ is coupled to ground via a resistor RE and a collector terminal of the transistor $Q_T$ is connected to a cathode of a first LED 192. An anode of the LED 192 is directly connected to a cathode of a second LED 193 to provide a series combination of LEDs. A voltage source Vs, coupled to an anode of the second LED 193, provides a voltage biasing signal to the series combination of the first LED 192 and the second LED 193. The transistor $Q_T$ is preferably a type 25C2710 and each of the LEDs is preferably an infrared LED marketed by NEC, model SE303A-C. A capacitor 194 functions as a decoupling capacitor to filter the voltage source $V_s$.

When the output signal provided by the ASIC 140 to the base terminal of the transistor $Q_T$ is high, the transistor $Q_T$ turns ON and sets a drive voltage across the resistor RE equal to the voltage level for the signal applied to the base terminal minus the base-emitter voltage for the transistor $Q_T$. In this manner, the drive voltage determines the current level applied to the first LED 192 and the second LED 193 because the transistor $Q_T$, in combination with the resistor RE, serves as a current source for the series combination of the LEDs. Consequently, the drive current supplied to the series combination of the LEDs is independent of the unregulated voltage provided by the voltage source $V_s$.

Referring now to FIGS. 4–5, when the carrier modulated program information signal represented by the waveform A is set at a logic one, the program information signal modulates the series combination of the LEDs at a rate determined by the first frequency, preferably 44.1 kHz. Described in another manner, the synchronized program information signal switches the transistor $Q_T$ ON or OFF to effectively modulate the series combination of the first LED 192 and the second LED 193 at a rate determined by the first frequency. In this manner, the remote control transmitter 190 transmits a program information message, or display information signal, to the remote control unit 200.

FIG. 5 is a schematic of the remote control receiver 195. The remote control receiver 195 includes a demodulator 196 and a photo diode 197. The photo diode 197 is coupled between an input of the demodulator 196 and ground. Specifically, a resistor RA is coupled between an anode of the photo diode 197 and ground and a cathode of the photo diode 197 is directly connected to the input terminal of the demodulator 196. When the photo diode 197 detects infrared energy, such as a command control signal from the remote control unit 200, the photo diode 197 outputs a detected infrared signal to the demodulator 196.

The demodulator 196 is preferably a type μPC1491HA marketed by NEC Corporation. Similarly, the photo diode 197 is preferably a model PHD 201 marketed by NEC. The demodulator 196 demodulates and filters the detected infrared signal and provides an output voltage signal to the receiver input terminal of the microprocessor 150 on line 198. Because the output terminal of the demodulator 196 is an open collector output, the output terminal of the demodulator 196 is pulled high via a resistor RB coupled between a voltage supply $V_{SS}$ and the output of the demodulator 196. The resistor $R_B$ also serves as a load resistance between the output of the demodulator 196 and the input to the microprocessor 150.

The demodulator 196 provides the specific functions of preamplification, band pass filtering, and detection of the detected infrared signal provided by the photo diode 197. The gain of the amplifying circuit included within the demodulator 196 is determined by the combination of a capacitor $C_A$ and an external resistor $R_C$.

A resistor $R_D$, coupled between the voltage supply $V_{ss}$ via an inductive choke $L_A$ and the band pass filter center frequency adjust input of the demodulator 196, determines the tuning frequency of the band pass filter circuit of the demodulator 196, in combination with the internal capacitor of the demodulator. The tuning frequency typically ranges from about 30 kHz to about 60 kHz, although the preferred embodiment is fixed at 56.875 kHz.

A capacitor $C_C$, coupled between the integral capacitor terminal of the demodulator 196 and ground, functions as an integral capacitor to filter or otherwise eliminate the carrier frequency associated with the detected signal provided by the photo diode 197. The carrier frequency is filtered to prevent the carrier frequency from being passed by the demodulator 196 to the microprocessor 150.

The filter circuit associated with the detector function of the demodulator 196 is determined by the capacitance value set by an external capacitor $C_D$. The capacitor $C_D$ is coupled between the detector capacitor input for the demodulator 196 and ground.

A decoupling capacitor $C_E$, preferably an electrolytic capacitor, filters the voltage level associated with the power supply $V_{SS}$ that is applied to the power supply input of the demodulator 196. Accordingly, the capacitor $C_B$ filters any interfering any noise signals supplied by the voltage supply $V_{ss}$.

Remote Control Unit

Referring now to FIG. 6, the preferred remote control unit 200 comprises a hand-held device including a display 209 for the control of the digital music tuner 100 and, in addition, for the control of a selected second device such as a cable converter set-top, television receiver, VCR, or the like. The top surface 222 of the remote control unit 200 includes an alphanumeric character display 209 and a matrix of contact switches forming a keypad 216. Each contact switch of the keypad 216 is covered by a push button or key that includes a label which defines the function or instruction initiated when the user presses the push button. In addition, selected areas of the top surface 222 of the remote control unit 200 include labels or other indicia that further designate the function or instruction associated with key.

FIG. 6 further illustrates certain operations conducted by the remote control unit 200, readily identified by the indicia associated with certain of the keys of the keypad 216. A user, who is a subscriber to both a digital music service and a cable television service, selects a control mode by pressing the CABLE button to initiate the control of a cable converter or, alternatively, by pressing the DMX button to initiate the control of the digital music tuner 100, i.e. the digital music mode of operation. The control mode selected by the subscriber is preferably displayed by the display 209, preferably with an annunciator such as the indicia 212, CABLE or DMX. Furthermore, the selected mode remains in continuous operation until the subscriber selects another mode of operation. For the preferred embodiment, the remote control unit 200 will operate in a default mode (the DMX or digital music mode) which enables the control of the digital music tuner 100 after power-on reset or upon a change of the battery.

Upon selecting the digital music mode of operation (DMX), the subscriber can control the functions of the tuner 100 in a manner similar to the use of currently popular wireless remote control units that control the functions of various consumer products, such as television receivers, VCRs, or CD players. Specifically, by pressing a selected key, the subscriber can initiate the transmission of a control command to the tuner 100 for either controlling a function of the tuner or requesting program information associated with a current program provided by the tuner. Each of the buttons or keys of the keypad 216 is labeled to indicate the function associated with the key.

For example, by pressing any key or a set of keys labeled with the Arabic numerals 0-9, a subscriber can select one of the available music channels provided by the tuner 100 for the listening pleasure of the subscriber, or alternatively, to select a cable channel when in the CABLE mode. Likewise, the keys labeled TUNE (up arrow) and TUNE (down arrow) may be used by the subscriber to, respectively, increment or decrement the music channel provided by the tuner 100, or alternatively, the tune the cable channel up or down when in the CABLE mode. In similar fashion, a volume up (VOL up arrow) and a volume down (VOL down arrow) keys can be utilized to control the volume level provided by the tuner 100. A POWER key may be utilized by the subscriber to either power on or power off the tuner 100 or other selected device. Also, a MUTE key is useful for eliminating the audible portion of the program provided by the tuner 100. Those persons skilled in the art will appreciate that such control functions are similar to the control functions provided by other wireless remote controls for consumer products.

Other control functions related to the control of the digital music tuner 100 by the remote control unit 200 include the control functions associated with the keys LAST, PRESET, STORE, TV, and SCAN. By pressing the LAST key, the user recalls the last music channel operated by the tuner 100. Furthermore, the user can utilize the PRESET and STORE keys to preset and store a favorite music channel for future operations by the digital music tuner 100. The TV function, which is provided by pressing the TV key, synchronizes the operation of the tuner 100 with a CATV channel for a simulcast broadcast of high quality audio and video program. The SCAN function permits the user to quickly review or scan the available music channels provided by the tuner 100.

The subscriber can also review the program information associated with a current program by inputting an information request for transmission to the tuner 100. By pressing the VIEW key, the subscriber initiates the transmission of an information request by the remote control unit 200 to the tuner 100. The tuner 100 processes the information request and initiates a search for program information associated with the current program. If the program information is not found by the tuner 100 within a predetermined time period, typically about two seconds, the tuner 100 will respond to the transmitted information request by transmitting an error message to the remote control unit 200.

Alternatively, if the search conducted by the tuner 100 discovers the program information, the tuner 100 will respond to the transmitted information request by transmitting the program information to the remote control unit 200 at a predetermined baud rate, preferably 4900 baud. The program information comprises the display information signal, described herein, and constitutes a program information message. A first or display information signal communications protocol associated with a transmission of the display information signals or program information messages by the tuner 100 is described in greater detail below.

Upon reception of the program information message, the remote control unit 200 processes the received program information by checking the message for a transmission error. The error-checking scheme utilized by the remote control unit 200 will be described in greater detail below.

After verifying that the message has been correctly received, the remote control unit 200 will direct the program information to the display 209 for communicating the message to the subscriber. Because the program information message can extend from one to five display fields of program information, the subscriber may be required to use the MORE button to display each message field of the program information message. When the last display field associated with the program information message is displayed by the display, the subscriber's next selection of the MORE button will cause the first display field to again be displayed by the display 209.

With respect to digital music signals, a typical program message includes information concerning the composer, the track title, the artist, and the album associated with the track title. Furthermore, the message may also include additional custom information concerning the current performance. The remote control unit 200 will also display operational messages indicating the progress of the processing of the information request, confirm the correct reception of the program information message, and provide an indication of errors if such errors occur during reception or processing.

During the CABLE mode of operation by the remote control unit 200, which is enabled when the subscriber presses the CABLE button, the remote control unit 200 will operate to control a selected cable television converter, otherwise known as a set-top, for a group of set-tops. The subscriber programs the remote control unit 200 to operate with the subscriber's existing set-top (or other selectable remotely controllable device) by pressing the CABLE and MORE buttons simultaneously for a time period greater than two seconds. In response to the subscriber's action, the display 209 will display a plurality of options for selection by the subscriber, for example, which one of a plurality of set-top converters the subscriber possesses. If the subscriber has already selected a set-top option, the currently chosen set-top option will be displayed by the display 209. Furthermore, additional options for set-tops or other remotely controllable devices that are operative for remote control by the remote control unit 200 are displayed for viewing by the subscriber when the subscriber presses the button MORE. In this manner, a menu of options will be provided to the subscriber to permit the subscriber to select a device for control by the remote control unit 200.

When the display 209 displays an option that matches the subscriber's device, the subscriber can select the presently displayed option by pressing the CABLE button to enable the remote control unit 200 to control the selected device. The option selected by the subscriber in this manner will continue to remain programmed for control by the remote control unit 200 until a power reset occurs or until the time that the subscriber elects another option. After a power reset of the remote control 200, the selected option will be cleared, thereby necessitating a new selection by the subscriber.

It should be understood that the preferred remote control unit 200 is pre-programmed to control a predetermined plurality of set-top converter units marketed by a variety of vendors within the CATV industry. In general, each vendor's set-top requires a unique second or control communications protocol for controlling the selected vendor's units. Consequently, the remote control unit 200 includes a preprogrammed read only memory (ROM) programmed to include a control communications protocols associated with the selected group of set-tops.

Referring now in this regard to FIG. 7, the preferred remote control unit 200 includes a processor 203, preferably a microcomputer or microcontroller, having on-board mask programmed memory, such as a read only memory (ROM) 203a. The memory 203a comprises a plurality of memory locations for storing parameters associated with various control signal protocols (in particular, for storing a plurality of parameters associated with different control protocols for different controllable devices). The preferred remote control unit 200 further includes a receiver 201, a transmitter 205, keypad 216, and a display 209.

In the preferred embodiment, the set-top control signal protocols are stored in the ROM 203a. Thus, when the subscriber selects a set-top or other device for control, the subscriber also selects the proper control signal protocol to communicate with and control the selected device. The control protocol includes the properly formatted codes associated with control functions for the selected set-top or other device.

For example, when the subscriber selects a Scientific Atlanta set-top (such as the Scientific Atlanta model 8600 set-top, one of the devices that is controllable by the preferred remote control unit 200), certain keys on the keypad 216 may be utilized by a subscriber to initiate a control function suggested by the label attached to the selected key, as described above.

The remote control unit 200 operates to control selected functions of the digital music tuner 100, as well as control selected functions of a selected controllable device, preferably the CATV converter set-top 300 (FIG. 1), and to receive program information associated with a current program provided by the digital music tuner 100. Nevertheless, those persons skilled in the art will appreciate that the remote control unit 200 could also receive video program information from the CATV set-top converter 300 if the converter is capable of receiving, processing, and sending a video program information signal associated with the video data. The following description concerning the communication of program information associated with digital audio data between the tuner 100 and the remote control unit 200 is representative of a communication of video program information data between a video program information compatible set-top and the remote control unit 200.

Referring again to FIG. 7, for a first operation mode, program information signals are received by the receiver 201 from the remote control transmitter 190 of the tuner 100. The received signal is then input into the processor 203 which processes and sends the program information signal to the display 209 for communicating program information corresponding to the currently playing audio track to a user. The display 209 is preferably an LCD, although an LED, a braille reader, a voice synthesizer, or a cathode-ray tube or any other communicating device could also be utilized as may be appreciated by those skilled in the art. Audible or tactile communicating means would allow communication of the program information signals to users with disabilities, as would the use of the remote control unit.

Preferably, the two-way communications link between the digital music tuner 100 and the remote control unit 200 is an IR communications link. However, RF, ultrasonic, wire, fiber-optic cables, or other means could be used as those skilled in the art can appreciate. The concept could also be extended to carrying the information on the household power lines, telephone wires, coaxial cable, fiber-optic cable, or means other than the direct connection of a cable to the first controlled device.

The keypad 216 receives control commands, such as program information commands associated with a request for program information, digital music tuner control commands associated with the control of the tuner 100, or set-top control commands associated with the control of a set-top converter 300, from a subscriber, which are sent to the processor 203. Those persons skilled in the art will recognize that each of the commands is input by a user to initiate the control of a selected function for either the tuner 100 or the set-top 300 by the remote control unit 200.

The processor 203 converts and sends a program information command or request and the digital music tuner control commands to the transmitter 205, which subsequently transmits the appropriate control signals to the remote control receiver 195 associated with the tuner 100. The received signal is input into the microprocessor 150 by the receiver 195, where appropriate signals are sent therefrom to the ASIC 140 and the tuner 110 so as to bring about the subscriber's desired control function, such as the selection of an audio track, audio channel, or the transmission of program information. Similarly, the processor 203 converts and sends the set-top control command signal to the transmitter 205, which subsequently transmits the set-top control command to the set-top converter 300 to initiate a particular commanded function.

The digital music tuner 100 could automatically update the display 209 whenever there has been a change in programming. For example, the tuner 100 could repeatedly or automatically transmit program information via the remote control transmitter 190 as opposed to transmission only in response to being polled (that is, a program information request is sent by the remote control unit 200). However, such an automatic update process might result in brief intervals during which the use of other control operations might be disrupted. Instead, in the preferred embodiment, before a program information signal is sent from the tuner 100, a program information request signal is sent by the transmitter 205 in the remote control unit 200. Nevertheless, those persons skilled in the art will recognize that the tuner 100 may operate to transmit program information either in response to being polled, or repeatedly.

The user may utilize the combination of the keypad 216 and the display 209 to select a set-top (or other controllable device) from a group of set-tops (or other controllable devices) and thereby enable the remote control unit 200 to control the selected set-top (or other controllable device). In this manner, the remote control unit 200 provides the flexibility of allowing the user to control an existing set-top if the existing set-top is included within the group of controllable set-tops. When the keypad 216 receives the appropriate control command from the user, the keypad 216 sends a selection command to the processor 203, which, in turn, processes the selection command and sends set-top menu selection data to the display 209.

In response to the set-top menu data, the display 209 displays a listing of the group of set-tops that are compatible for control by the remote control unit 200. The user can subsequently select a controllable set-top from the group identified by the display 209 by using the keypad 216 to input a set-top selection signal. The processor 203 accepts the set-top selection signal from the keypad 216 and enables the remote control unit 200 to control the selected set-top. The group of set-tops are preferably representative of the popular converter set-tops marketed by various vendors and available for present use by user.

Once a particular set-top converter (or other controllable device) is selected for operation, the preferred processor 203 is further operative for storing identification indicia in a memory, such as a scratchpad memory associated with the preferred microcomputer, corresponding to selection of the selected controllable device from amongst the plurality of controllable devices. The remote control unit 200 is thereafter operative to retrieve protocol parameters corresponding to the identification indicia from the scratchpad memory, so that appropriate control protocol for the selected device is utilized for communications to the selected device.

Although the preferred embodiment operates to control a controllable set-top selected from a group of set-tops, the remote control unit 200 could also be programmed to enable a user to select and control another controllable device selected from a group of controllable devices, such as digital music tuners, VCRs, television receivers, and the like. Those skilled in the art will appreciate that the user could select a controllable device from a group of controllable devices in a manner similar to the selection of the controllable set-top heretofore described.

Still referring to FIG. 7, the memory 203a stores the incoming program information signal, the identification indicia associated with the selected controllable device, the set-top menu data, and operating software for the processor 203. The memory 203a preferably includes both random access memory (RAM) and read only memory (ROM). For the preferred embodiment, the RAM is utilized to temporarily store the program information prior to communicating such data via the display 209, as well as the identification indicia. In contrast, the ROM is utilized to store utilized to improve both the on-axis IR receiver range and the off-axis IR receiver range by increasing the received signal level in comparison to the signal level achieved by the use of only a single PIN photo diode as an IR receiver. Each of the photo diodes D1 and D2 is preferably a model PH310 marketed by NEC Corporation.

Although a photo diode will detect an IR signal without the application of a reverse-bias voltage signal, the voltage level provided by $V_{cc}$, when selectively applied to the cathode of each of the photo diodes D1 and D2 via the voltage junction $V_1$ increases the sensitivity of each diode to IR signal energy. A resistor R2, connected between the junction formed by the cathodes of the photo diodes D1 and D2 and the voltage junction $V_1$, functions as a bias resistor to apply the proper DC voltage bias level to the diodes.

A capacitor C4 coupled between the junction formed by the cathodes of the photo diodes D1 and D2 and Found, functions as a decoupling filter to AC filter the voltage level provided by the power supply $V_{cc}$, and thereby provide a proper AC ground for the diodes D1 and D2.

The voltage level associated with the voltage junction $V_1$, a junction between the collector terminal of a transistor Q2 and a resistor R4, is determined by the operating state of the transistor Q2. In turn, the operating state of the transistor, preferably a PNP transistor, is determined by the bias voltage signal applied by the processor 203 to the base terminal of the the operating software and a plurality of parameters associated with different communications protocols associated with the various groups of controllable devices. Those skilled in the art will appreciate that the memory 203a either could be internal or external to the processor 203.

Figure 8B:
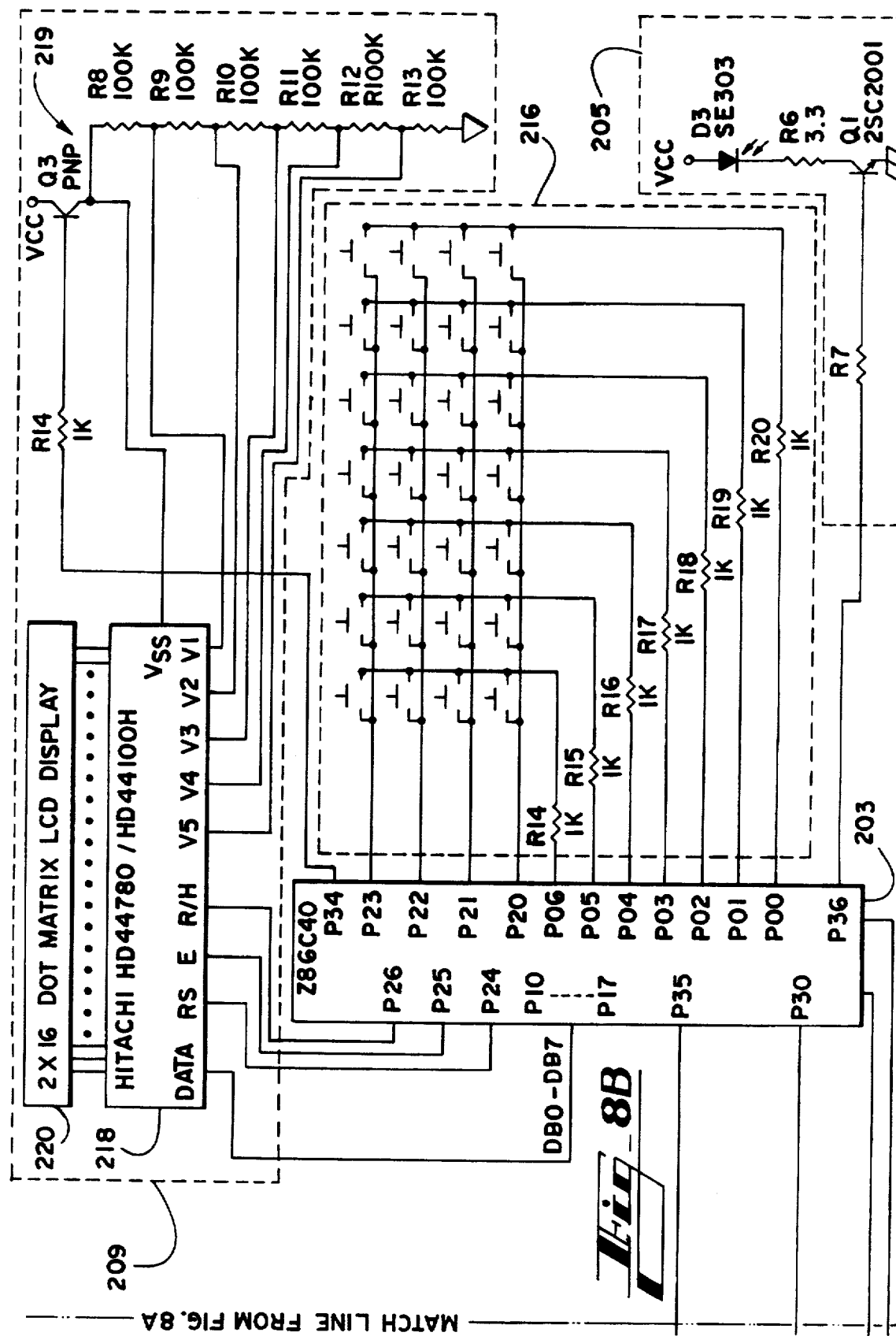

Referring now to FIGS. 8A and 8B, the details of the preferred remote control unit 200 will be provided. The processor 203 in the preferred embodiment is a type Z86C40 marketed by Zilog, Inc., and is selected for low cost and low power consumption features. The preferred Z86C40 is a CMOS 8-bit, single-chip microprocessor having 4k bytes of internal ROM and 236 bytes of RAM. Consequently, the memory 203a is internal to the preferred Z86C40 as internal RAM and ROM. The preferred processor 203 includes plurality of input/output ports, designated with as PXY, where X is a port identifier numeral and Y is a particular pin identifier of a given port.

The receiver 201 in FIG. 8A includes a preamplifier 210 and a parallel combination of PIN photo diodes D1 and D2. The photo diodes D1 and D2 are coupled between a voltage junction $V_1$ and the input of the remote control preamplifier 210. Each of the PIN photo diodes D1 and D2 receives the program information message signal transmitted by the remote control transmitter 190 of the digital music tuner 100, and the parallel combination provides a detected information signal having a particular carrier frequency to the preamplifier 210. The parallel combination of photo diodes D1 and D2 is preferably transistor Q2. A resistor RS, coupled between one of the output port lines P35 of the processor 203 and the base terminal of the transistor Q2, functions as a base bias resistor to determine the proper bias level for the voltage signal supplied by the processor 203.

When the P35 output of the processor 203 is low, the transistor Q2 is turned ON and, simultaneously, the junction between the collector terminal of the transistor Q2 and the resistor R4, otherwise defined as the voltage junction $V_1$, is elevated to approximately the-voltage level set by the power supply $V_{cc}$. The operating state of the transistor Q2, as controlled by the processor 203, determines the operating state of the receiver 201 because voltage level associated with the power supply $V_{cc}$ is applied to the power supply input of the preamplifier 210 and each cathode of the parallel combination of the diodes D1 and D2 only when the transistor Q2 is in the ON state. In this manner, the receiver 201 drains current from the power supply $V_{cc}$, preferably a battery $BT_1$, only when the processor 203 is operational, i.e., when the remote control 200 is utilized by the user. The power supply $V_{cc}$ is a positive voltage source set for an operational voltage of +5 volts.

Provided, for example, as a type µPC1473HA marketed by NEC Corporation, the remote control preamplifier 210 provides the functions of preamplification, peak detection, and output waveform shaping. The preamplifier 210 accepts the detected information signal produced by the combination of the photo diodes D1 and D2 and provides an amplified and filter voltage signal for sufficient amplitude and waveform shape for processing by the processor 203. Those skilled in the art will appreciate that the preamplifier 210 effectively operates as a demodulation system that demodulates the detected information signal by filtering the particular carrier frequency and providing a pulsed voltage signal as an output signal to the processor 203.

Still referring to FIG. 8A, a tuning circuit 204 formed by the combination of inductors L1 and L2, capacitors C1 and C9, and a resistor R1, in conjunction with an external resistor R3, determines the gain for the preamplifier 210. Specifically, the gain for the preamplifier 210 is calculated as the ratio of the impedance provided by the tuning circuit to the resistance value set by the external resistor R3.

The tuning circuit 204 provides a high impedance value at the carrier frequency for the transmitted information signal, in this case, 44.1 kHz, while simultaneously setting a relatively large bandwidth characteristic for the preamplifier 210 that includes attenuation of out-of-band signals.. The bandwidth requirement for the preamplifier 210 is determined by the data rate of the transmitted information signal received by the receiver 201. In the preferred embodiment, the bandwidth of the preamplifier 210 is about 24 kHz to 32 kHz, for a preferred data rate of 4900 baud associated with the transmitted information signal.

The tuning circuit 204, comprising the inductor L1, the inductor L2, the capacitor C1, and the capacitor C9, provides a fourth order symmetrical band pass filter. The tuning circuit 204 is adjusted by the inductor L2 to provide a filter center frequency of 44.1 kHz.

The tuning circuit 204 provides a transfer function that includes three zeroes at zero frequency (DC) and one zero at infinite frequency. This transfer function defines the out-of-band attenuation characteristic for the band pass filter. In particular, the three zeroes at zero frequency define an out-of-band attenuation characteristic that approaches 60 dB/decade at very low frequencies near the zero frequency. In addition, the one zero at infinite frequency defines an out-of-band attenuation characteristic of approximately 20 dBb/decade at frequencies much higher than the band pass frequency.

The resistor R1 operates as a load resistance and sets the bandwidth and the shaping of the tuning circuit 204. Specifically, the tuning circuit 204 operates to transform the resistance value associated with the resistor R1 to a much higher impedance at the center frequency of the pass band filter provided by the tuning circuit 204. The tuning circuit 204 insures that the maximum gain for the preamplifier circuit of the preamplifier 210 is set at the carrier frequency of interest, 44.1 kHz.

In addition, a capacitor C3, coupled between ground and the external resistor R3, forms an RC filter with the external resistor R3 to determine the low frequency characteristic for the preamplifier 210. In particular, the combination of the capacitor C3 and the external resistor R3, functions as a high pass filter to filter low frequency signals below approximately 3 kHz and thereby eliminate interference signals such as fluorescent light interference.

The time constant for the peak hold circuit associated with the peak detection function of the preamplifier 210 is determined by the capacitance value set by a capacitor C2. The capacitor C2 is coupled between the peak hold capacitor input for the preamplifier 210 and the voltage junction $V_1$. A capacitor C5, coupled between the integral capacitor terminal of the preamplifier 210 and ground, functions as an integral capacitor to delete the carrier waveform associated with the transmitted information signal. The carrier frequency is filtered to prevent the carrier frequency of 44.1 kHz from being passed by the preamplifier 210 to the processor 203.

A decoupling capacitor C8, preferably an electrolytic capacitor, filters the voltage level associated with the power supply $V_{cc}$ that is applied via the junction $V_1$ to the power supply input of the preamplifier 210. In this manner, the capacitor C8, coupled between the power supply input for the preamplifier 210 and ground, filters any interfering noise signals supplied by the power supply $V_{cc}$.

The output of the preamplifier 210, which is an open collector transistor, is pulled-up to the voltage of the power supply $V_{cc}$ through the resistor R4, which is coupled between the output of the preamplifier 210 and the collector terminal of the transistor Q2. The output of the preamplifier 210 is provided to input port P30 of the processor 203. The resistor R4 further determines the impedance level between the input of the processor 203 and the output of the preamplifier 210.

The processor 203 in FIG. 8B operates upon the output signal and provides processed information data to the display 209 in the form of alphanumeric characters. The display 209 includes a display driver 218, a drive voltage circuit 219, and a matrix display 220. The display driver 218 and the matrix display 220 are preferably matched components provided by the same vendor, such as the HD44100H driver and the HD44780 display marketed by Hitachi. Those skilled in the art will recognize that a single module including both the driver and LCD display functions could also be utilized to provide the display 209.

The operating clock for the processor 203 is set by a crystal Y1. In the preferred embodiment, the crystal Y1 operates at a frequency of 8.192 MHz. Capacitors C6 and C7, each coupled between a selected terminal of the crystal Y1 and ground, function to filter interference signals from the clock signal provided by the crystal Y1 to the processor 203.

The output port P34 of the processor 203, which is connected to the base terminal of a transistor Q3 via a bias resistor R14, controls the operating state of the transistor Q3 and, consequently, the operating state of the display 209, including the driver 218, the drive circuit 219, and the matrix display 220. The emitter terminal of the transistor Q3 is connected to the power supply $V_{cc}$ and the collector terminal of the transistor Q3 is connected to the voltage supply input of the driver 218. The transistor Q3 is preferably a PNP transistor.

Because the processor 203 provides a bias signal through the bias resistor R14 to the base terminal of the transistor Q3, the transistor Q3 is turned on when the P34 output of the processor 203 is low. The collector terminal of the transistor Q3 shifts to a voltage level that is approximately the voltage provided by the power supply $V_{cc}$ during the ON state for the transistor Q3. In this manner, the supply voltage provided by the power supply $V_{cc}$ is directed to the voltage supply input of the driver 218. Similar to the operation of the receiver 201, the display 209 drains supply current from the power supply $V_{cc}$ only when the processor 203 operates to provide the proper bias signal to turn the transistor Q3 ON and thereby provide a signal path between the power supply $V_{cc}$ and the driver 218.

In addition, the voltage level at the collector terminal of the transistor Q3 determines the drive voltage signals provided by the drive voltage circuit 219 to the driver 218. The drive voltage circuit 219 includes the transistor Q3, a set of series resistors R8—R13, and the resistor R14. Specifically, the set of series resistors coupled between the collector terminal of the transistor Q3 and ground, resistors R8—R13, are tapped at selected junctions between selected pairs of the resistors to determine the drive voltages applied to the driver 218. The first resistor in the series set, the resistor R8, is coupled between the emitter terminal of the transistor Q3 and the next resistor in the series set, the resistor R9. Likewise, the last resistor in the series set, the resistor R13, is coupled between ground and the next-to-last resistor in the series set, the resistor R12.

For example, a first junction between the resistor R8 and the resistor R9 determines a first drive voltage level applied to driver 218. The first drive voltage level is determined by the voltage drop associated with the application of the collector terminal voltage through the resistor R8. In similar fashion, the second drive voltage level applied to the driver 218 is determined by the voltage drop set by the application of the collector voltage level through the resistor R8 and the resistor R9. Likewise, the third, fourth, and fifth drive voltages are determined by the cumulative voltage drops set by the selected series resistors.

The processor 203 provides processed information data to the driver 218 after the processor 203 provides a read-write signal and an enable signal to the driver 218. Subsequently, the driver 218 operates upon the processed information data and provides the processed information data for display by the matrix display 220. For the preferred matrix display HD44780, the matrix display is an LCD that is programmed to display two lines, each line consisting of 16 dot matrix characters for a total display of thirty-two (32) characters.

The keypad 216, which comprises a matrix of contact switches, is connected to the processor 203 to enable the user to input commands for the operation of the remote control unit 200. The keypad 216 defines a matrix of four rows 216AD by seven columns 216A–G of contact switches. Each of the rows 216A–216D is directly connected to an input port line of the processor 203. In contrast, each of the columns 216A–216G is connected to inputs of the processor 203 via a resistor selected from resistors R14–R20. The processor 203 scans the contacts associated with each of the matrix of contact switches to detect a threshold voltage indicating that the user has pressed a selected switch or switches.

Each of the contact switches for the keypad 216 represents an instruction associated with the control of a control device or the control of the functions associated with the remote control unit 200. Accordingly, by pressing a selected contact switch or, alternatively, pressing a selected sequence of contact switches, the user can send an instruction for operation by the processor 203.

The optical signal transmitter 205 includes a transistor Q1, a current limiting resistor R6, a bias resistor R7, and an infrared LED D3. The P36 output of the processor 203 is connected to the base terminal of the transistor Q1 through the bias resistor R7. The collector terminal of the transistor Q1 is coupled to the cathode of an LED D3 via the current limiting resistor R6 and the emitter terminal of the transistor Q1 is connected to ground. The anode of the LED D3 is connected to the power supply $V_{cc}$. The transistor Q1 is preferably a high speed switching transistor, such as the NPN transistor provided by the model 25C2001. The LED D3 is an IR light emitting diode, preferably a model SE303 marketed by NEC Corporation.

To initiate the transmission of a control command signal, the processor 203 provides the control command signal to the base terminal of the transistor Q1 at a predetermined carrier frequency, preferably 56.875 kHz. For example, when the P36 output of the processor 203 goes high, the collector terminal of the transistor Q1 also goes high to reverse-bias the LED D3. Accordingly, the P36 output of the processor 203 switches the transistor Q1 ON and OFF and thereby produces, respectively, a high or low voltage level at the collector terminal of the transistor Q1 that, in turn, forces the LED3 to either the ON or OFF state. By operating as a transistor switch, the transistor Q1 enables the output of the processor 203 to effectively modulate, the LED D3 to effect the transmission of an IR control command signal.

It will be appreciated that the foregoing discloses a remote control system for controlling the digital music tuner 100 and the CATV converter set-top 300 by use of a remote control unit 200, and furthermore, for communicating program information corresponding to a selected set of digital audio data between the tuner 100 and the remote control unit 200, wherein the remote control unit 200 is remotely located from the tuner 100 and the set-top 300.

FIG. 9 is a state diagram and FIGS. 10A an 10B are state tables illustrating the various states of operation for the remote control unit 200 as implemented by the operating software of the processor 203. The remote control unit 200 operates in one of eight separate states after the user powers-up the remote control unit. Specifically, the remote control unit 200 can operate in one of three independent idle states—state 1, otherwise referred to as an idle mode with display; state 2, otherwise referred to as an idle mode without display; and state 3, otherwise referred to as an idle mode with mode annunciators.

During each of the idle states, states 1-3, the remote control unit 200 does not operate to receive program information from the tuner 100, nor does the remote control unit 200 operate to control either the tuner 100 or a selected set top 300. Instead, the remote control unit 200 is idle, or in essence, waits for the user to initiate an operation, such as the reception of a program information message from the tuner 100, the control of either the tuner 100 or the set-top 300 via the keypad 216, or the selection of a particular set-top from the group of set-tops to initiate the control of that set-top by the remote control unit 200.

The remote control unit 200 can also operate in either state 4, a transmit mode, or state 5, a data receive mode. During the transmit mode, the remote control unit 200 operates to transmit a control command in response to the user inputting such a control command via the keypad 216. In contrast, during the receive mode, the remote control unit 200 operates to receive a program information message from the tuner 100.

The remote control unit 200 can further operate in an error display state, otherwise referred to as state 6. During the error display state, the remote control unit 200 operates to display an error message to the user via the display 209. Such error display messages preferably include such messages as "ERROR—PLEASE TRY AGAIN", "NO DATA RECEIVED PLEASE TRY AGAIN", "NO DATA AVAILABLE", or the like.

During state 7, an information display state, the remote control unit 200 operates to provide the user with a display of a current field of information, such as a data definition or category (such as ARTIST, or TITLE) and an associated data field of a program information message that may contain as many as five data fields.

During a final state of operation, state 8, otherwise known as a cable set-up mode, the remote control unit 200 operates in a mode that enables the user to select a preferred set-top for control by the remote control unit 200.

The preferred display 209 is operative to display textual information by displaying alphanumeric characters. During the idle mode with display, the display 209 provides one of two annunciators 212 (see FIG. 6)—CABLE corresponding to cable mode, or DMX corresponding to tuner control mode. For the preferred embodiment, upon power-up, the display 209 displays the DMX annunciator and is operative to control the tuner 100 as the default mode of operation.

If the user does not press a key located on the keypad 216 within a predetermined time period $T_1$, preferably 2 seconds, the remote control unit 200 will change operating states and move to state 2, the idle mode without display. During the idle mode without display, the display 209 remains blank and does not provide the user with any display concerning either cable or DMX mode information. Furthermore, the display 209 does not display either the DMX annunciator or the CABLE annunciator. The remote control unit 200 will remain within the idle mode without display until the user presses a key located on the keypad 216, to conserve battery power.

For the idle mode with annunciator state, the display 209 will display either the DMX annunciator or the CABLE annunciator for the appropriate active mode of operation. The remote control unit 200 will remain within the state 3, the idle mode with annunciator, during a time period $T_2$, preferably about 0.5 seconds. After the time period $T_2$ expires, the remote control unit 200 changes operating states and returns to state 2, the idle mode without display, to conserve power.

During the transmit state, the display 209 does not provide the user with a textual display; however, the display 209 indicates the operating mode of the remote control unit 200 by providing either the DMX annunciator or the CABLE annunciator. Upon entering the transmit state in response to the input of a control command via the keypad 216, the remote control unit 200 does not accept another control command input by the user until the initial transmission is completed by the remote control unit 200. Specifically, the user cannot utilize the CABLE key, the DMX key, the VIEW key, the MORE key, or any other control command key during the time interval that the remote control unit 200 operates in the transmit state. Upon completing a transmission, the remote control unit 200 changes operating states and moves to the state 3, the idle mode with annunciator.

During the state 5, the data receive state, the display 209 displays the textual message "RETRIEVING DATA". In addition, the display 209 provides the user with an indication of the operating mode of the remote control unit 200 by providing the user with either the DMX annunciator or the CABLE annunciator. During the data receive state, the remote control unit 200 operates to receive a program information message from the tuner 100. The user cannot utilize the CABLE key, the DMX key, the VIEW key, the MORE key, or any other control command key during the time interval that the remote control unit 200 operates in the data receive state. If the remote control unit 200 does not receive any data after a predetermined time period $T_3$, preferably about two seconds, the remote control unit 200 changes operating states and moves to the error display state to provide the user with the second message "NO DATA RECEIVED PLEASE TRY AGAIN".

In addition, if the remote control unit 200 receives a bad or incomplete program information message from the tuner 100, the remote control unit 200 also moves to the state 6, the error display state, to display an error message such as "ERROR—PLEASE TRY AGAIN". Likewise, when the remote control unit 200 receives a program information message that contains all empty data fields, otherwise referred to as an empty message, the remote control 200 changes operating states and moves to the error display state to display the error message "NO DATA AVAILABLE".

During the error display state, the display will provide the user with an error display message for a predetermined time interval, T4, preferably five seconds. After the expiration of the predetermined time interval $T_4$, the remote control unit 200 changes operating states by returning to state 2, the idle mode without display.

However, if the remote control unit 200 receives an error-free message, otherwise known as a good message, the remote control unit 200 changes operating states by moving to the state 7, the information display state, to display the data fields of the program information message.

The remote control unit 200 will provide the user with a display of a current field of information for a predetermined time period $T_5$, preferably about ten seconds. After the expiration of the predetermined time period $T_5$, the remote control unit 200 moves to the idle mode without display.

The user can enter the state 8, cable set-up mode, from any of the operating states, except for the states 4 and 5, the transmit and data receive states, by pressing the CABLE and MORE keys simultaneously for a time period greater than a predefined time interval $T_6$, preferably greater than two seconds. By entering the cable set-up mode, the user can select the preferred set-top for control by the remote control unit 200.

During the control set-up mode, the display 209 will provide the user with a menu of selectable controllable set-tops. In particular, the display 209 will provide the user with a textual display of an easily recognizable name for a controllable set-top. When the user presses the MORE key, the display 209 will provide the user with a textual display of another such set-top option. In this manner, the user can scroll through a menu of selectable set-tops by pressing the MORE key. Once the user reaches the final controllable set-top choice included within the displayable menu, the display 209 will again provide the user with a display of the first controllable set-top choice when the user next presses the MORE key.

When the display 209 displays the textual information concerning the user's preferred set-top, the user can select that controllable set-top for control by the remote control unit 200 by pressing the CABLE key. Upon locking-in the user's choice of the controllable set-top, the remote control unit 200 returns to the state 1, the idle mode with display. Moreover, identification indicia are stored in the memory 203a corresponding to selection of a selected controllable device from amongst the plurality of controllable devices. The remote control unit 200 is thereafter operative to retrieve protocol parameters corresponding to the stored identification indicia in memory, so that the appropriate control protocol for the selected device will be used for sending signals to the selected device. If the user does not press either the CABLE key or the MORE key within a time period defined by $T_5$, the remote control unit 200 returns to state 2, the idle mode without display.

By pressing a selected key located on the keypad 216, the user can change the operating state of the remote control unit 200. In particular, by pressing the CABLE key, the DMX key, the VIEW key, the MORE key, or all other control command keys, otherwise known as the transmit keys, the user can change the operating state of the remote control unit 200.

By pressing the CABLE key during any of the idle states, states 1–3, the error display state, or the information display state, the user can select the cable mode of operation for the remote control unit 200. After the user presses the CABLE key, the cable mode of operation is set and the remote control unit 200 returns to the state 1, the idle mode with display. In contrast, during the transmit state and the data receive state, the user cannot select the cable mode of operation by pressing the CABLE key because the remote control unit 200 does not accept such a keyboard input by the user during such operating states. In addition, during the cable set-up mode, the user selects the preferred controllable set-top by pressing the CABLE key and, consequently, the user cannot select the cable mode of operation by pressing the CABLE key in the state 8.

Similar to the CABLE key, the user selects the DMX mode of operation by pressing the DMX key during each of the idle states, states 1–3, the error display state, and the information display state. After pressing the DMX key, the remote control unit 200 operates in the DMX mode and returns to the idle mode with display. The user does not effect a change of operational states by pressing the DMX key during the transmit state, the data receive state, or the cable set-up mode state.

By pressing the MORE key during each of the idle states, the remote control unit 200 moves to the state 6, the error display state, to display the error message "ERROR PLEASE TRY AGAIN" on the display 209. In contrast, when the MORE key is selected by the user during the information display state, the display 209 displays the next data field of information, such as a data field of the program information message, when the processor 203 increments a software pointer to prompt the display 209 to display the next date field. However, the user cannot initiate an operation by pressing the MORE key during the transmit state, the data receive state, or the error display state.

After the user presses the VIEW key during any of the idle states, the error display state, or the information display state, the remote control unit 200 returns to the data receive state to initiate the operation to receive a program information message from the tuner 100. The user cannot initiate the data receive state by pressing the VIEW key during the transmit state, or the cable set-up mode state. Likewise, the VIEW key does not initiate another data receive operation when the remote control unit 200 is already operating with the data receive state.

The majority of keys located on the keypad 216 are control command keys that permit the user to initiate a selected control command function for the tuner 100 during the DMX mode of operation or the set-top 300 for the CABLE mode of operation. During each of the idle states, states 1–3, the error display state, and the information display state, the user initiates the transmit state by pressing any of the control command keys, otherwise referred to as the transmit keys. However, the user cannot initiate the transmit state if the remote control unit 200 is currently operating within the data receive state or the cable setup mode state. Likewise, the user cannot initiate another control command by pressing a control command key when the remote control unit 200 is presently operating in the transmit state to initiate a previously selected control command.

FIG. 11 depicts aspects of the selection of a second or control communications protocol associated with the control of a selected controllable device, such as a set-top selected from a group of controllable set-tops, or the control of the tuner 100. The user can select a CATV set-top converter, such as the set-top 300, from a group of controllable set-tops communicated by the display 209 during the operation of the remote control unit 200 in state 8, the cable set-up mode. By selecting a controllable set-top during the cable set-up mode state, the remote control unit 200 is enabled to control the selected functions of the selected set-top. Specifically, during the cable set-up mode, the user's set-top selection, which is displayed by the display 209, is input via the keypad 216 to the processor 203 to initiate the selection of the appropriate second communications protocol associated with the selected set-top. The processor 203 retrieves from memory 203a appropriate protocol parameters associated with different control protocols corresponding to different controllable devices, and assembles a complete control message formatted in a selected control or second communications protocol for the selected device. The appropriately formatted control message is provided to the transmitter 205, which transmits a control command signal within the second communications protocol associated with the selected set-top.

It will be understood that, in the preferred embodiment, more than one second communications protocol is stored within the memory 203a, preferably ROM, because, in general, each vendor's controllable set-top has a separate and unique second communications protocol associated with the control-Of selected functions for that vendor's selected set-top.

FIG. 11 illustrates that that memory 203a comprises a plurality of memory locations for storage of selected parameters of second communications protocols associated with the group of controllable devices that may be controlled by the use of the remote control unit 200. Likewise, the memory 203a stores selected parameters of the second communications protocol associated with the digital music tuner 100. Although in the preferred embodiment, the user is not provided with an option to select a digital music tuner from a group of controllable digital music tuners, those skilled in the art will appreciate that the remote control unit 200 could be programmed to control one of a group of controllable digital music tuners and, therefore, the memory 203a could include parameters of second communications protocols associated with a group of controllable digital music tuners.

It should be understood at this juncture that communication protocols (such as control protocols) typically have several layers, each of which may be considered a "protocol" in and of itself. For example, and shown in FIG. 11 and as described below in connection with FIG. 12, various different remote control devices utilize different device level or transmission level protocols for defining a logical "1" and a logical "0" generated by a transmitting device. By example and not by way of limitation, a typical logical "1" comprises a period T1 of modulated carrier, a period T2 of no carrier, a period T3 of modulated carrier, and a period T4 of no carrier. A typical logical "0" comprises a period T1 of modulated carrier, a period T2 of no carrier, a period T3 of no carrier, and a period T4 of no carrier. Storage of the parameters T1, T2, T3, and T4, plus the period T5 of the modulated carrier, uniquely identify the protocol or bit format for "1" and "0".

In addition to such device level or transmission level protocols such as bit format protocols, there are protocol parameters associated with character definition or word definition, sometimes called character layer protocols. For example, characters or words typically comprise a predetermined number of bits, such as 7 or 8, sometimes with start and stop bits. As shown in FIG. 11, again by way of example and not by way of limitation, a typical word format or character format comprises eleven bits, with a "0" start bit, followed by five pair of data bits and complemented data bits, Bit 4, Bit 4/, Bit 3, Bit 3/, Bit 2, Bit 2/, Bit 1, Bit 1/, Bit 0, Bit 0/. Thus, a word format protocol may require storage in memory 203a of a parameter or parameters indicative that eleven bits of information are required to define a word or character, with the first bit being a "0" start bit.

There are yet still further layers of protocols sometimes utilized in data communications. For example, a message layer protocol typically entails assembly of groups of characters into predetermined message portions. FIG. 13 below illustrates the assembly of characters provided with lower layer protocols to form a message or a control command.

For purpose of the present invention, a "protocol" is not meant to be limited to either device layer, character or word layer, or message layer protocols, it being understood that any or all of such protocols are defined by predetermined parameters, and that all of such parameters required to completely define a communication or message from the remote control unit 200 to a selected controlled device are stored in the memory 203a.

FIG. 11 also shows exemplary storage of typical protocol parameters and selection of same for a selected device. For example, the remote control unit is operative to select one of controllable devices 1 through n. As described above in connection with state tables of FIGS. 10A and 10B, when in the cable set-top mode (state 8), the current set top selection is displayed on the display 209. The current set top selection comprises the NAME TO DISPLAY shown in FIG. 11, which constitutes alphanumeric characters associated with the device.

Associated with the displayed NAME TO DISPLAY is a pointer 202 to memory locations, denominated POINTER TO TRANSMIT PARAMETERS. This pointer 202 is a software pointer to locations in the memory 203a. These memory locations store the protocol parameters required to communicate with a selected device, such as a TRANSMIT ROUTINE #, CUSTOM ID CODE, KEY DATA 1 . . . KEY DATA n, and time parameters T1, T2, . . . Tn.

The TRANSMIT ROUTINE # comprise software routines for the processor 203 that enable the processor to implement a particular or selected control protocol. The CUSTOM ID CODE is a predetermined code that identifies the remote control unit 200 as an authorized or operative remote controlling device. The KEY DATA n parameters relate particular digital codes to particular keys or switches associated with control functions for a selected controlled device. Finally, the timing parameters T1, T2, . . . Tn correspond to the timing parameters described above for defining bit or word formats.

Consequently, by selecting a particular set-top, a software pointer 202 utilized by the processor 203 selects the appropriate memory locations to retrieve the protocol parameters associated with the second communications protocol for the particular set-top. A similar pointer operation is conducted for the selection of the digital music tuner.

Figure 12:
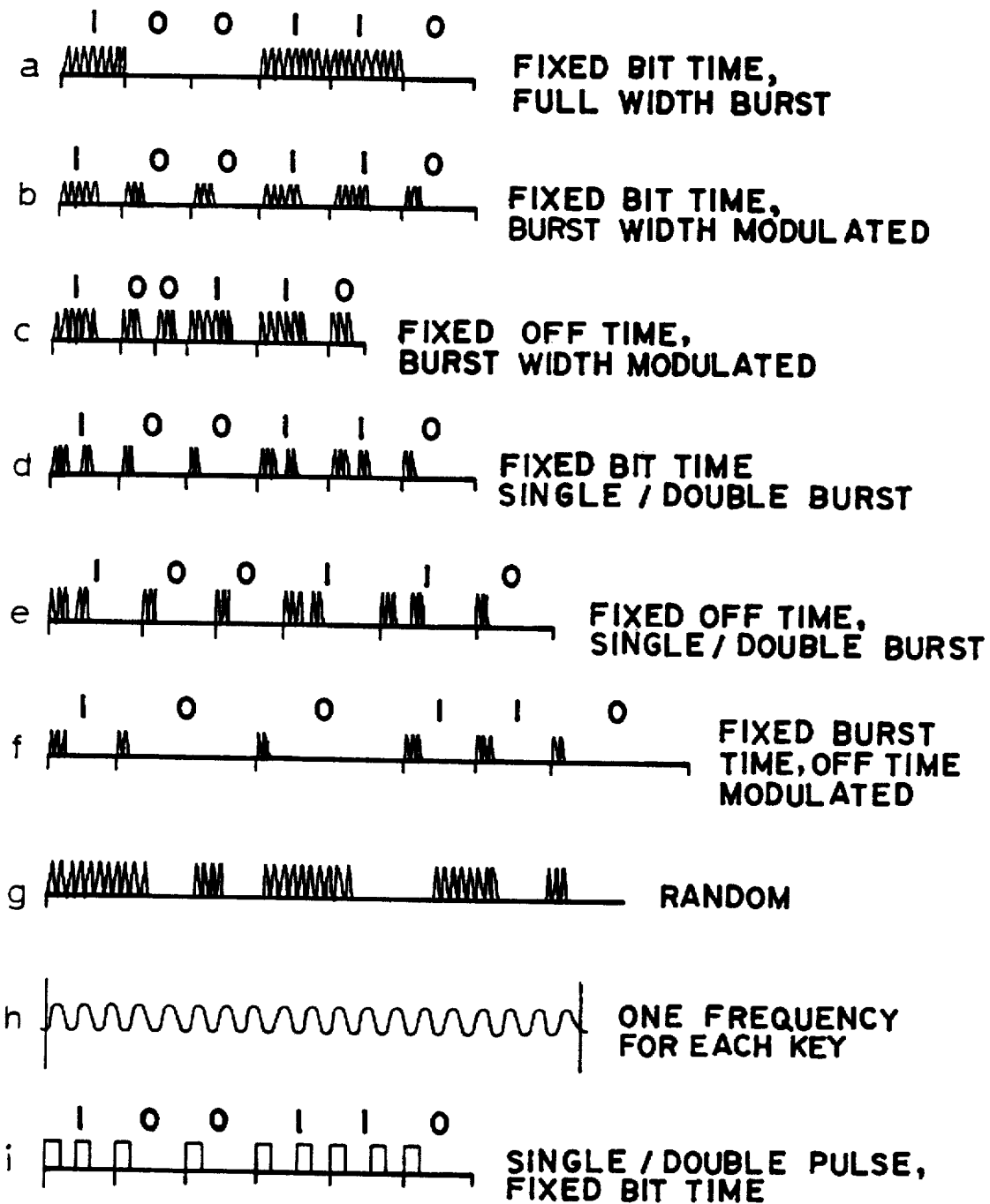
FIG. 12 illustrates various modulation schemes or waveforms associated with different control protocols utilized in various different remotely controllable devices, with which the preferred remote control unit shown in FIG. 6 can be made operative.

Turning now to FIG. 12, in order to understand the manner in which the preferred embodiment implements the storage and usage of control signals or protocols for controlling various different controlled devices, the commonly used control signals or protocols, most often implement as infrared codes, must first be understood. This turns out to be a very wide range of different codes. FIG. 12, which is identical to FIG. 1 of U.S. Pat. No. 4,623,887 to Welles, II, illustrates several modulation schemes. FIGS. 12a through 12g are different types of gated carrier frequencies. Typical carrier frequencies for infrared remote transmitters are 20 kHz to 60 kHz, with the majority at 38 kHz and 40 kHz. The gating schemes illustrated include both fixed and variable bit periods, non-return to zero (NRZ), variable burst width, single/double burst modulation schemes, and a final catch-all category called random because there is no readily distinguishable pattern of ones and zeros.

In addition to these schemes, there is also a transmitter which puts out a different continuous frequency (CW) for each key at approximately 300 Hz spacings as represented in FIG. 12h. Finally, several new types of transmitters do not use a carrier frequency at all but, instead, send a stream of pulses where the data is encoded in the spacing between infrared pulses as shown in FIG. 12i.

FIG. 12 shows certain data modulation schemes, but most transmitters also have a higher level of data organization, which may be called a keyboard encoding scheme. This causes data to be sent in different formats depending on the transmitter and the key pressed. Those skilled in the art will understand that several of these keyboard encoding schemes are known in the art, as illustrated and discussed in the referenced U.S. Pat. No. 4,623,887. In some systems, data is sent once for each key press. In other systems, data is repeated three times and then stopped for each key press. These schemes are used to conserve power and extend battery life. In yet other systems, data is repeatedly sent as long as the key is pressed. This is often used for continuous functions such as volume control or channel scanning. In still other systems, there is a modification of the continuous repeat scheme where the initial key data is sent, followed by a series of "keep-alive" pulses as long as the key is pressed. This scheme is also used to conserve power and extend battery life.

In addition to these schemes, some remote control transmitters precede all transmitted key data with some form or preamble data stream to get the receiver's attention. It will be understood that such preamble data stream can be used with each of the above-described keyboard encoding schemes.

From the foregoing, it will be understood that various infrared remote control devices for different set-top converters, VCRs, television sets, and the like manufactured by different vendors (i.e., second controlled devices) are controlled with different control protocols. It will be further understood that these "control protocols" or "control signals", as the terms are used herein, include various modulation schemes, keyboard encoding schemes, preamble data streams, keep alive pulse schemes, and other control information. It will therefore be understood that each of these control protocols include various parameters that define the protocol, including but not limited to carrier frequency (and period), bit codes defining preamble codes, bit codes defining key encoding schemes, numbers associated with the times a signal is repeated, and the like.

In order to implement the control protocol for a selected one of plurality of different controlled second devices, it is therefore necessary to store data in the remote control unit 200 corresponding to the particular parameters of the control protocol for each of the second devices that the remote control unit 200 is capable of controlling. The present invention is then operative, in the manner described herein, to enter a mode for selecting one of the plurality of second controlled devices, retrieve the appropriate and corresponding protocol parameters stored in ROM corresponding to the identification indicia stored in memory, and transmit an infrared control signal formatted in the selected control protocol for the selected controlled second device so as to cause the selected device to implement a command corresponding to the key pressed.

FIG. 13 illustrates the control communication data format or control protocol 401, sometimes called a message layer protocol, utilized by the preferred remote control unit 200 in controlling the tuner 100. However, it should be understood that the control protocol 401 is exemplary of second or control protocols often utilized in infrared remote control transmitters. It should be understood that the control protocol 401 is implemented by utilizing particular modulation schemes such as shown in FIG. 12, and that both the modulation scheme and the data format shown in FIG. 13 are both considered "protocols," albeit at different levels. The control protocol 401 comprises four separate portions, including a start pulse 402, a custom ID code portion 404, a data portion 408, and an (optional) error checking portion 411. The first portion, a start pulse 402, comprises one bit and is utilized to synchronize the operation of the remote control receiver 190. The second portion, the custom ID code portion 404, comprises six bits and is utilized to distinguish the control protocol associated with the tuner 100 from other control protocols. A third portion, the data portion 408, comprises six bits of actual control data. The (optional) error checking portion 411 is used in some systems to provide a measure of error checking via cyclic redundancy check (CRC) codes or the like.

The data transmitted within the data portion 408 is provided to the tuner 100 by first transmitting the least significant bit of the data portion. To insure an accurate reception of a control command signal, each signal is transmitted twice by the remote control unit 200 in the preferred embodiment. The tuner 100 will not interpret two consecutive control command signals to be separate signals unless these control command signals are separated by a time interval of at least 250 milliseconds. Furthermore, all control command signals transmitted by the remote control unit 200 are preferably separated by a time interval of approximately 33 milliseconds of dead space before beginning another transmission. In this manner, the tuner 100 can distinguish separate control command signals from the pair of repeated control command signals.

By now, it should be understood that the tuner 100 also utilizes a first or display information communications protocol to send a program information message to the remote control unit 200. Each program information message consists of a maximum of 160 characters that, once received, can be displayed by the remote control unit 200 when the subscriber presses the VIEW key. The program information message comprises up to five message fields, wherein each message field includes two lines of 16 characters each, to provide a total of 32 displayable characters. Each character is defined by a character format that is similar to the format utilized for RS-232 serial interface, non-return-to-zero (NRZ) transmission.

The preferred character data format is defined by a series of ten bits that begins with a start bit, followed by eight data bits, and concludes with a stop bit. The start bit, defined as a logic 0, indicates the start of a character and the stop bit, defined as a logic HIGH, indicates the completion of a character and the conclusion of a character bite. As those skilled in the art will recognize, a logic HIGH is indicated by a high level and a logic LOW is indicated by a low logic level.

Refer now to FIG. 14 for discussion of a table describing the first or display information communications protocol 501 for communicating a program information message between the tuner 100 and the remote control unit 200. The protocol 501 is defined by a plurality of defined fields, comprising a start text or start of transmission field <STX>, a sequence # (number) field <Seq. #>, a group of definition fields <Def. Field n> interweaved with an associated group of data fields <Data Field n>, a group of error detection fields <CRC-7 Field n>, an end of text field <EOT>, a message error detection term <CRC-7 All>, and an end text or end of message field <ETX>.

FIG. 14 specifically illustrates the preferred protocol for the program information message utilized in the preferred embodiment, having a maximum message length of five data fields. The start text field, <STX> comprising one character, indicates the start of a program information message. Furthermore, the sequence number <Seq. #>, comprising one character, indicates the number of the present message within a repetition sequence (each message is sent four times, so that the sequence number field increments by one for each of the four transmissions).

Each data field <Data Field n> includes an associated definition field <Def. Field n>, which defines the class of information provided by the corresponding data field. Each definition field comprises one character. In contrast, each data field <Data Field n> comprises 32 characters.

It should be understood at this juncture that in the preferred embodiment, the definition fields comprise coded information signals and the data fields comprise coded information signals. The memory 203a stores a string of alphanumeric characters associated with each of a plurality of coded information signals. The processor 203 is responsive to the coded information signals or definition fields for retrieving selected alphanumeric characters from memory and for generating a corresponding alphanumeric display on the display 209.

Stated in other words, the coded information signals correspond to a plurality of "headers" or predefined data categories to be displayed on the display 209. For example, a single predetermined character code provided in the first definition field causes the display of the character string "TITLE" on the display, a single predetermined character code provided in the second definition field causes the display of the character string "TRACK", and a single predetermined character code provided in the third definition field causes the display of the character string "ARTIST". Moreover, the uncoded information signals correspond to particular items of data within one of the predefined data categories to be displayed on the display, for example, the particular title of the music being played, the particular track number, and the particular artist's name. The display 209 is operative to display predetermined alphanumeric characters corresponding to the coded information signals, prior to displaying alphanumeric characters corresponding to the uncoded information signals.

For a program information message including five data fields, a message further includes five definition fields, wherein each definition field <Def. Field n> is associated with a corresponding data field <Data Field n> to define the category of the corresponding data field <Data Field n>. Each definition field <Def. Field n> represents a predefined data category that is stored in the memory 203a, preferably the ROM. Prior to displaying a data field associated with a particular definition field, the display 209 displays the predefined data category to introduce the message information of the data field that will follow the particular definition field. The storage of such often-used data categories, such as title, track, artist, composer, or the like, each associated with a definition field <Def. field n> within the memory 203a of the remote control unit 200, eliminates any requirement for the tuner 100 to transmit such information within a data field, thereby reducing the total length of a program information message and speeding up the transfer of the program information message.

Each error detection field <CRC-7 Field n> is associated with a corresponding pair of a definition field <Def. Field n> and its corresponding data field <Data Field n>. Each error detection field <CRC-7 Field n>, which comprises one character, provides an error calculation term for the associated pair of the definition field <Def. Field n> and its corresponding data field <Data Field n>. In this manner, the remote control unit 200 may verify the accuracy of the received program information message by comparing a calculated error detection term for a received pair comprising a definition field and a data field to the error detection field associated with the pair. The message error detection term <CRC-7 All>, comprising one character, enables the remote control unit 200 to verify the accuracy of the entire program information message by comparing the message error detection to a calculated error detection term associated with the entire program information message.

The end of text field <EOT>, comprising one character, indicates the end of the textual data associated with the program information message. Also, the end of message field, <ETX>, comprising one character, indicates the conclusion of an entire program information message.

Furthermore, for the program information message including five data fields, the message further includes five error detection fields, wherein each of the error detection fields <CRC-7 Field n> is associated with a corresponding pair of a definition field <Def. Field n> and its corresponding data field <Data Field n>.

The tuner 100 transmits the same program information message for a predetermined number of times, preferably four times, before terminating the transmission to the remote control unit 200. The opportunity for the remote control unit 200 to repeatedly receive the same program information message insures that the remote control unit 200 is more likely to accurately receive an entire, error free program information message prior to displaying the message for the convenience of the subscriber.

When the remote control unit 200 polls the tuner 100 by transmitting a control command signal requesting a program information message to the tuner 100, the tuner 100 conducts a search for the beginning of the next program information message associated with the current program being provided via the cable. The search conducted by the tuner 100 is completed when the tuner 100 detects a start of transmission field <STX> within a predetermined time period. The tuner 100 then proceeds to repetitively send the same detected program information message to the remote control unit 200 during four separate intervals without first buffering or storing the complete program information message within a memory. Consequently, the maximum time interval necessary for the remote control unit 200 to receive a complete program information message is a first time interval defined by the four transmissions of the same program information message, and a second time interval defined by the tuner's search for the beginning of a complete message, i.e., the start of transmission field, <STX>, otherwise recognized as a latency period. In the preferred embodiment, the maximum: time period for reception of a complete program information message by the remote control unit 200 is approximately 2 seconds.

If a program information message is not available at the tuner when the subscriber presses the VIEW key of the remote control unit 200, the tuner 100 will transmit an error message for reception and display by the remote control unit 200. Specifically, the tuner 100 will transmit three FFh (HEX) followed by four end-of-message fields to indicate the absence of the program information message at the tuner 100. In addition, if the subscriber presses the VIEW key during the interval when the tuner 100 changes programs, the tuner 100 will transmit four end of message fields to terminate the communication between the tuner 100 and the remote control unit 200.

FIG. 15 illustrates the method utilized by the preferred remote control unit 200 to verify the accuracy of the received program information message. This method is implemented as a program for the processor 203.

To insure the rapid and accurate transmission and reception of the program information message, the first or display information protocol includes the group of error detection fields, wherein each error detection field is associated with a data pair comprising a definition field and its corresponding data field. Thus, starting at 601 in FIG. 15, the first inquiry at 602 is whether a definition field and its associated data field, and their associated error detection field have been received.

At step 605, the inquiry is made whether the received data pair have already been stored as an error free data pair. If yes, the block 601 is returned to for receipt of the next data pair. If not, at step 608 the data pair and associated error detection field are sent to the processor for further processing.

At step 612, the remote control unit 200 calculates an error detection term for each of the pairs of the definition fields and the corresponding data fields included within a received program information message. To verify the accuracy of the received program information message, at step 615 the remote control unit 200 compares the calculated error detection value to the error detection field included within the program information message for each of the definition field and the corresponding data field. If an error is detected, a "not received" flag is stored at 620, indicative that the particular data pair has not been received and stored as error free.

If no error is detected at 615, the data pair comprising the definition field and the data field are stored as an error free data pair at step 623.

At step 625, the processor determines whether all n of a plurality of data pair have been stored as error free. If so, all n data pair are sent to the display 209 for display at step 628. It is at this point that the single character of the definition field of the data pair is replaced by the corresponding data string on the, display, for example, "ARTIST" or "TITLE", while all characters of the data field of the data pair are displayed as is on the display 209.

If at step 625 all n data pair have not been received, the program branches to 630, where the inquiry has been made whether all m transmissions of the program information message have been sent. It will be recalled that in the preferred embodiment, there are at least four transmissions of each entire message, so m equals four. If all m transmissions have already been sent, the program branches to 633 and an error message, for example, "ERROR—PLEASE TRY AGAIN", "TRANSMISSION NOT RECEIVED", or the like, is displayed on the display 209. If all m transmissions have not occurred, the program branches back to 601 and attempts to obtain the data pair on a subsequent transmission.

It will be understood that these steps are repeated for each of the fields associated with a selected program information message, and the message is accumulated within the memory 203a, preferably the RAM associated with the processor 203. The processor 203 operates upon each accumulated pair of the definition field and the corresponding data field to calculate an error detection term associated with the accumulated pair. If the calculated error detection term matches the error detection term associated with the accumulated pair, the processor 203 identifies that accumulated field as an error-free field and stores the error-free field in the memory 203a. The error detection term is calculated by starting with the definition field and ending with the last byte of the corresponding data field. If the calculated error detection term does not match the term provided by the error detection field, the processor 203 repeats the error detection calculation process for the same pair provided by a subsequent transmission of the program information message because the tuner 100 repetitively transmits the message four separate times. The processor does not calculate an error detection term for any accumulated pair that has already been identified by the processor 203 as an error-free field.

This error detection calculation process is repeated until each pair of the definition field and the corresponding data field is identified as an error-free field or until the last transmission of the program information message is accumulated and processed by the remote control unit 200. Consequently, if each of the five pairs of the definition field and the corresponding data field is identified as an error-free field after the first transmission of the program information message, the processor 203 ignores the subsequent transmission of the same program information message, retrieves each of the stored error-free fields, and initiates a display of the program information message.

Furthermore, the remote control unit 200 calculates an entire message error detection term based upon the entire program information message, beginning with the start text field and concluding with the end of text field, to verify the accuracy of the entire received program information message. The calculated entire message error detection term is compared to the entire message error detection field to validate the received program information message. Accordingly, the calculation of the entire message error detection term provide a redundant check for the accuracy of the received program information message.

The remote control unit 200 preferably utilizes a cyclic redundancy check (CRC) for the error detection calculation associated with each of the pairs of the definition field and the corresponding data field and for the error detection calculation associated with the entire program information message. Those persons "skilled in the art will recognize that other well known error detection calculations could be utilized to calculate an error detection term associated with the program information message.

From the foregoing description of the preferred embodiment, it will be appreciated that the present invention overcomes the disadvantages of the prior art and achieves the objects and advantages of the invention recited above. From the description, other embodiments will suggest themselves to those skilled in the art. Therefore, the scope of the present invention is to be limited only by the claims below.

What is claimed is:

1. An improved, hand-held remote control apparatus for communicating with and selectively controlling at least one remotely located device, said at least one remotely located device being operative to carry out controllable function upon receipt of a command delivered by a control signal from the remote control apparatus, comprising:

a receiver responsive to a display information signal transmitted by said at least one remotely located device, said display information signal comprising alphanumeric character information;

a keypad circuit receiving an operator input corresponding to a selected command for delivery to said at least one remotely located device and providing a command signal;

a transmitter transmitting a control signal corresponding to said selected command to said at least one remotely located device in response to said command signal; and a display displaying alpha-numeric characters associated with said display information signal, and providing an indication that the remote control is waiting for display information to be received.

2. The apparatus as recited in claim 1 wherein said display provides said indication in response to the command signal.

3. The apparatus as recited in claim 1 wherein said display includes the LCD that displays one or more symbols to indicate that the remote control is waiting for information to be received while data is being transmitted to said at least one remotely located device.

4. The apparatus as recited in claim 3 wherein said display displays an alpha-numeric symbol to indicate that the remote display control is waiting for display information to be received.

5. The apparatus as recited in claim 4 wherein said display displays said alpha-numeric characters after displaying one or more symbols in response to the alphanumeric character information being received.

* * * * *

UNITED STATES PATENT AND TRADEMARK OFFICE
CERTIFICATE OF CORRECTION

PATENT NO. : 5,455,570
DATED : October 3, 1995
INVENTOR(S) : Alex M. Cook, et al It is certified that error appears in the above-indentified patent and that said Letters Patent is hereby corrected as shown below:

On the title page, add item [73]:

Assignee: Scientific-Atlanta,    ., Norcross, Ga.

Signed and Sealed this

Seventh Day of October, 1997

BRUCE LEHMAN

*Attest:*

*Attesting Officer*           Commissioner of Patents and Trademarks